US010529609B2

(12) United States Patent
Rebstock

(10) Patent No.: US 10,529,609 B2
(45) Date of Patent: Jan. 7, 2020

(54) CONTAINER STORAGE ADD-ON FOR BARE WORKPIECE STOCKER

(71) Applicant: Brooks CCS GmbH, Radolfzell (DE)

(72) Inventor: Lutz Rebstock, Gaienhofen (DE)

(73) Assignee: Brooks Automation (Germany) GmbH (DE)

( * ) Notice: Subject to any disclaimer, the term of this patent is extended or adjusted under 35 U.S.C. 154(b) by 0 days.

(21) Appl. No.: 14/513,214

(22) Filed: Oct. 14, 2014

(65) Prior Publication Data

US 2016/0247701 A1  Aug. 25, 2016

Related U.S. Application Data

(63) Continuation of application No. 13/225,547, filed on Sep. 5, 2011, now Pat. No. 8,888,434.

(51) Int. Cl.
*H01L 21/677* (2006.01)
*H01L 21/687* (2006.01)

(52) U.S. Cl.
CPC .. *H01L 21/67769* (2013.01); *H01L 21/68707* (2013.01)

(58) Field of Classification Search
CPC .......... H01L 21/67769; H01L 21/6773; H01L 21/67754; H01L 21/67775; H01L 21/67763; H01L 21/67379; H01L 21/68707; B65G 1/0407; B65G 1/04; B65G 1/0485; B65G 1/0457; B65G 1/0478; B65G 1/06
USPC ........................................................ 414/940
See application file for complete search history.

(56) References Cited

U.S. PATENT DOCUMENTS

| | | | |
|---|---|---|---|
| 5,746,008 A * | 5/1998 | Yamashita | H01L 21/67057 34/211 |
| 5,788,448 A | 8/1998 | Wakamori et al. | |
| 5,980,183 A | 11/1999 | Fosnight | |
| 6,398,476 B1 * | 6/2002 | Ando | B65G 1/137 414/273 |
| 6,582,174 B1 * | 6/2003 | Hayashi | H01L 21/67769 414/217 |
| 6,612,797 B1 | 9/2003 | Bonora et al. | |
| 6,811,369 B2 * | 11/2004 | Yamada | H01L 21/67769 414/217.1 |
| 6,914,251 B1 * | 7/2005 | Weed | H01L 21/67775 250/491.1 |
| 7,039,499 B1 | 5/2006 | Nasr | |
| 7,887,276 B2 * | 2/2011 | Natume | B66F 11/00 414/217 |

(Continued)

FOREIGN PATENT DOCUMENTS

| | | |
|---|---|---|
| JP | 03109750 | 5/1991 |
| JP | 06244266 A * | 9/1994 |

(Continued)

OTHER PUBLICATIONS

PCT preliminary report on patentability—PCT/IB2012/054560—dated Mar. 12, 2014.

*Primary Examiner* — Glenn F Myers
(74) *Attorney, Agent, or Firm* — Perman & Green, LLP; Colin C. Durham

(57) ABSTRACT

The present invention relates to apparatuses and methods to store and transfer objects, and more particularly to workpiece stocker configurations such as stocker for semiconductor wafers, reticles or carrier boxes.

20 Claims, 26 Drawing Sheets

(56) References Cited

U.S. PATENT DOCUMENTS

| | | | | |
|---|---|---|---|---|
| 8,177,550 B2* | 5/2012 | Haraki | H01L 21/67109 | 414/940 |
| 8,277,161 B2* | 10/2012 | Aburatani | H01L 21/67109 | 414/217 |
| 8,423,175 B2* | 4/2013 | Abe | H01L 21/67109 | 700/214 |
| 8,851,819 B2* | 10/2014 | Kamikawa | H01L 21/67727 | 414/222.07 |
| 8,974,167 B2* | 3/2015 | Ito | H01L 21/67769 | 414/217 |
| 2003/0077150 A1* | 4/2003 | Matsuda | H01L 21/67201 | 414/217 |
| 2005/0129496 A1* | 6/2005 | Heiland | H01L 21/68707 | 414/744.1 |
| 2007/0288121 A1 | 12/2007 | Shibazaki | | |
| 2008/0232937 A1* | 9/2008 | Abe | H01L 21/67265 | 414/222.02 |
| 2008/0236488 A1* | 10/2008 | Takeshita | C23C 16/4401 | 118/719 |
| 2009/0142167 A1* | 6/2009 | Gage | H01L 21/67196 | 414/221 |
| 2009/0196716 A1 | 8/2009 | Rebstock | | |
| 2010/0204826 A1* | 8/2010 | Sawado | H01L 21/67769 | 700/228 |
| 2010/0241271 A1 | 9/2010 | Shimizu | | |

FOREIGN PATENT DOCUMENTS

| | | |
|---|---|---|
| JP | 08213446 | 8/1996 |
| JP | 11334810 | 12/1999 |
| JP | 2002231785 | 8/2002 |
| JP | 2002544678 | 12/2002 |
| JP | 2007219931 | 8/2007 |
| JP | 201212283 | 11/2012 |
| WO | 9846503 | 10/1998 |
| WO | 2004034438 | 4/2004 |

* cited by examiner

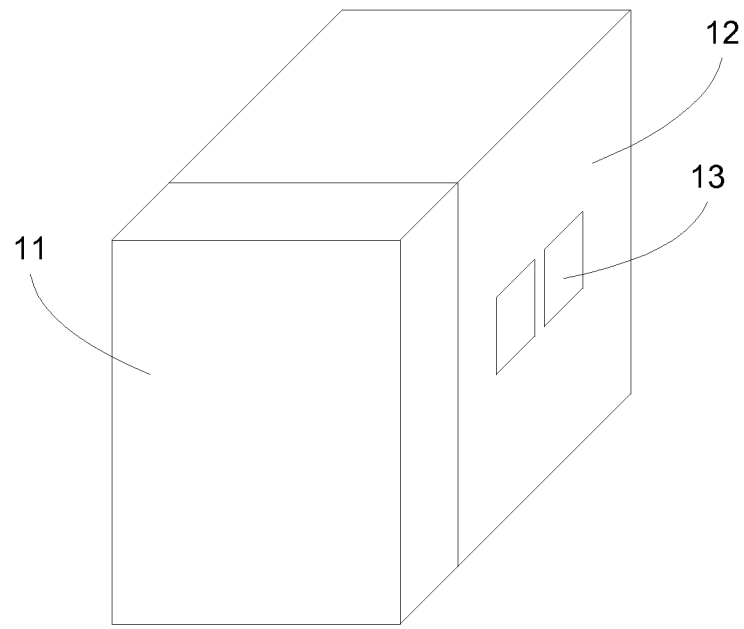
Fig. 1A
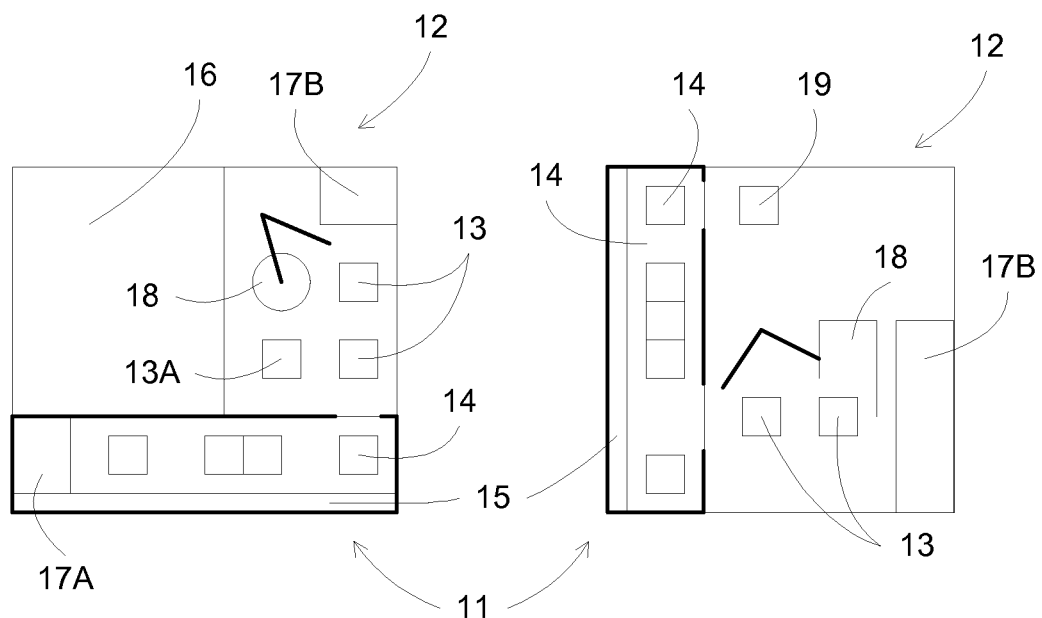
Fig. 1B
Fig. 1C

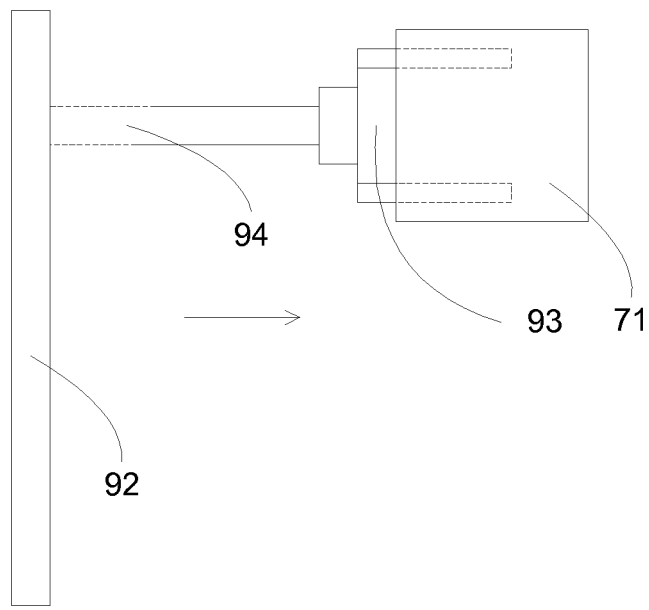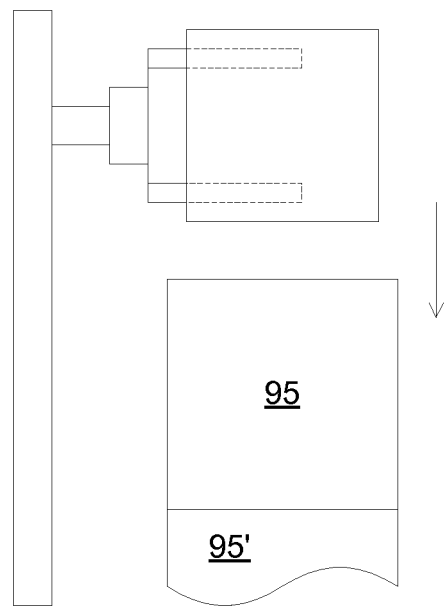
Fig. 9A　　　　　　　　　　Fig. 9B
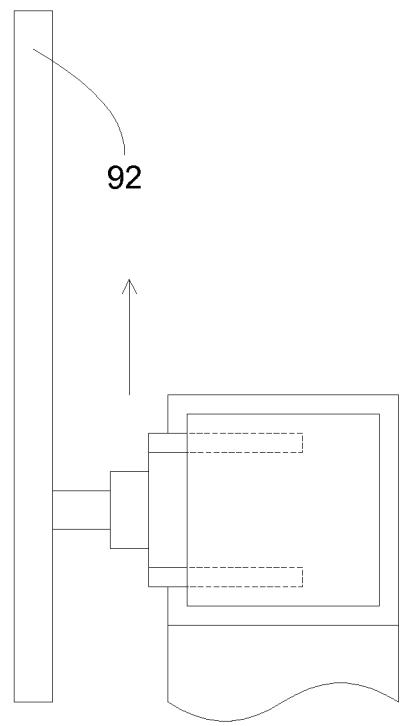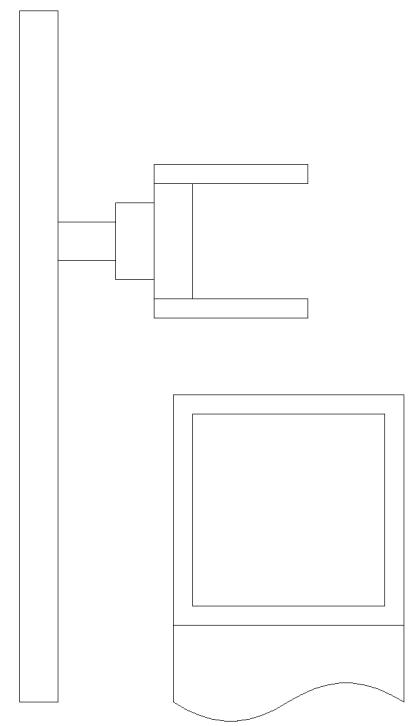
Fig. 9C　　　　　　　　　　Fig. 9D

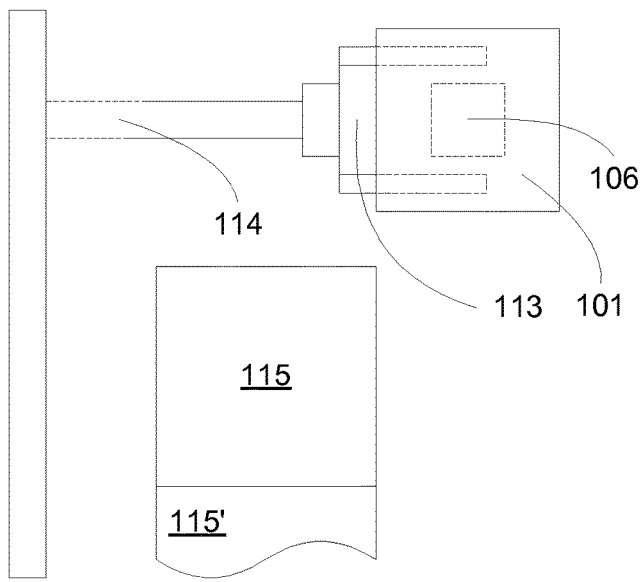
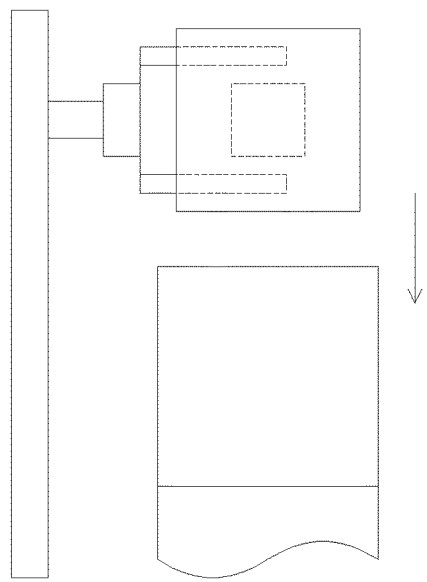
Fig. 11A    Fig. 11B
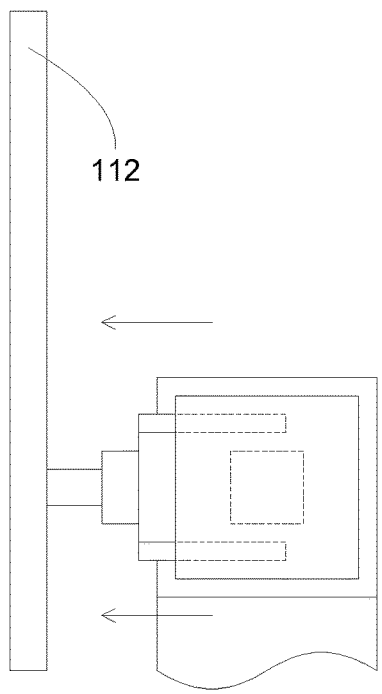
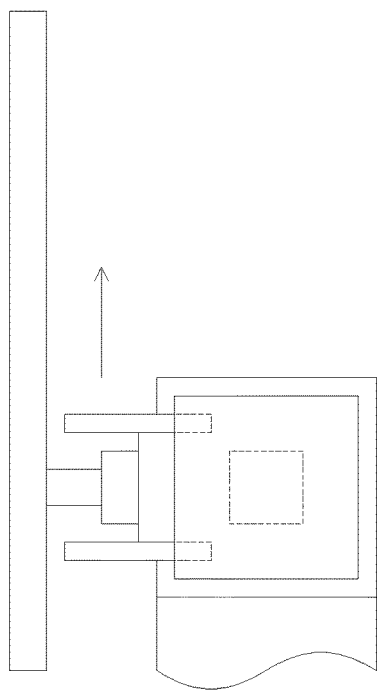
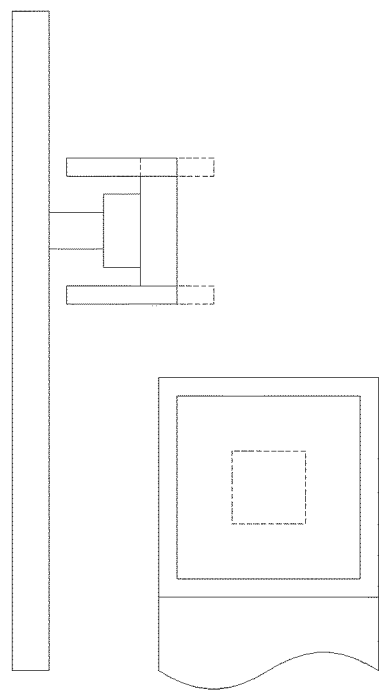
Fig. 11C    Fig. 11D    Fig. 11E

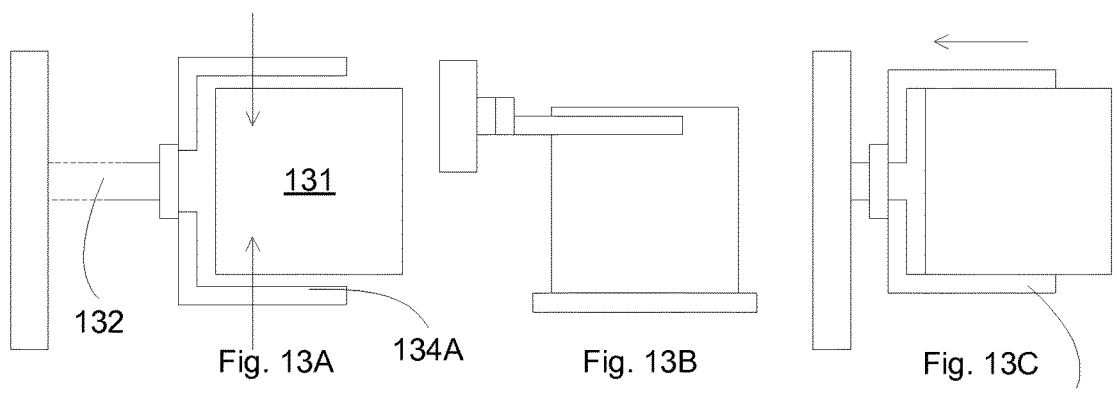
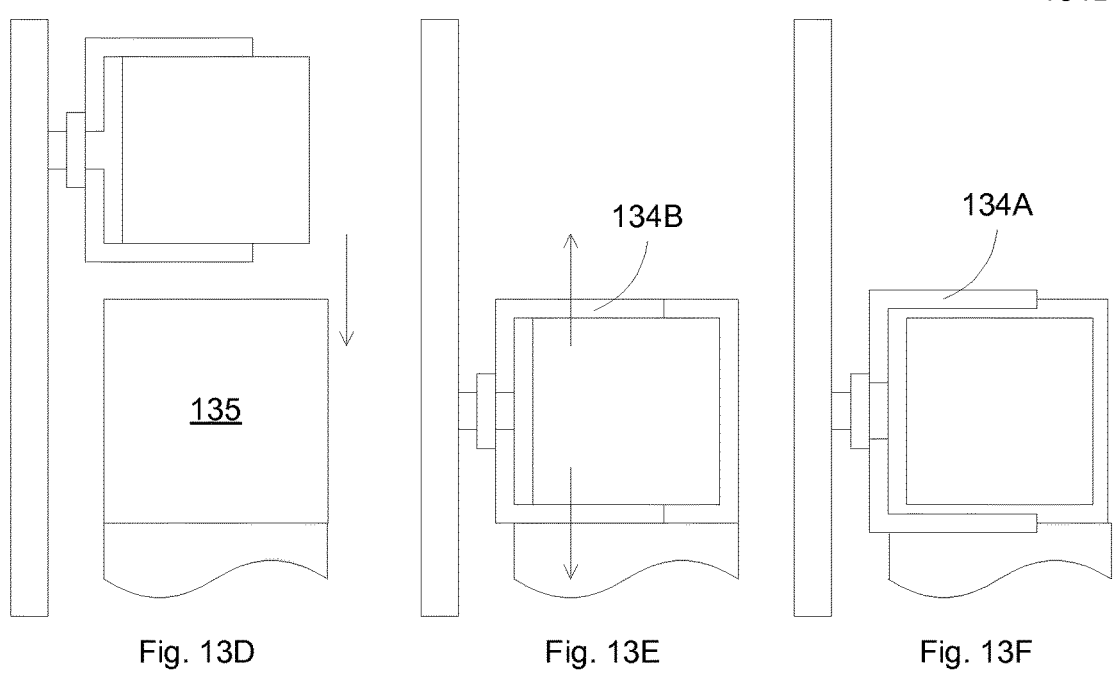
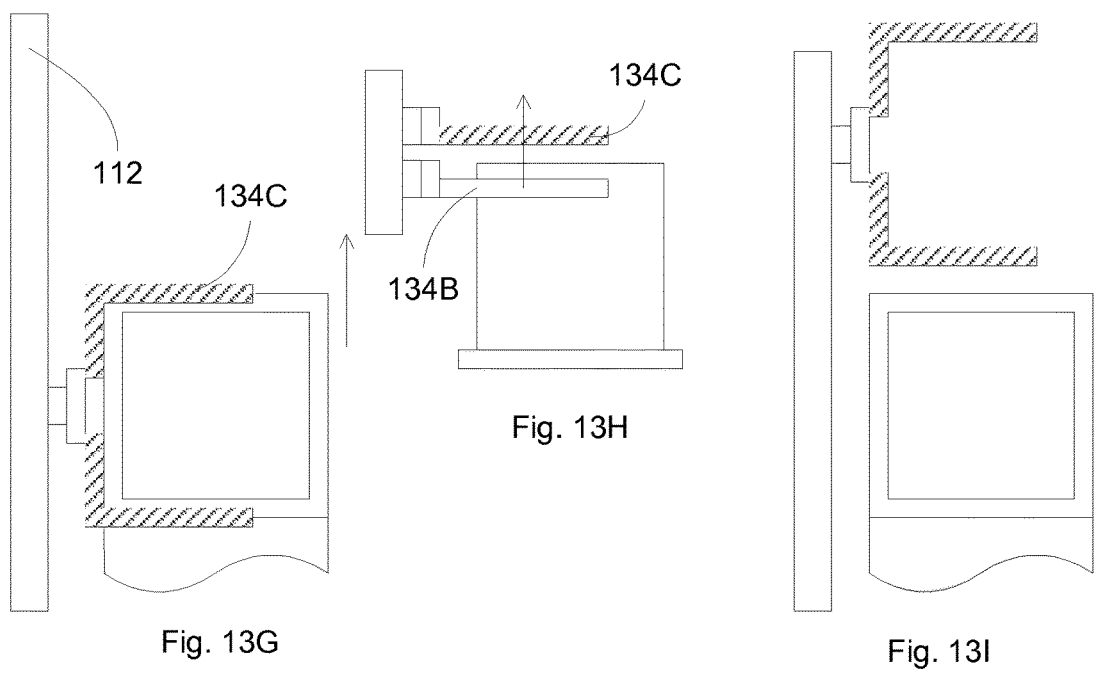

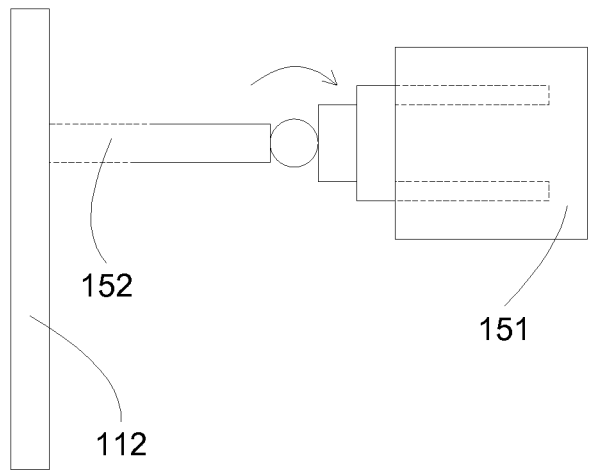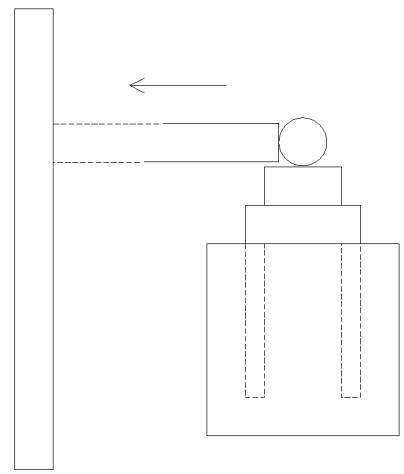
Fig. 15A  Fig. 15B
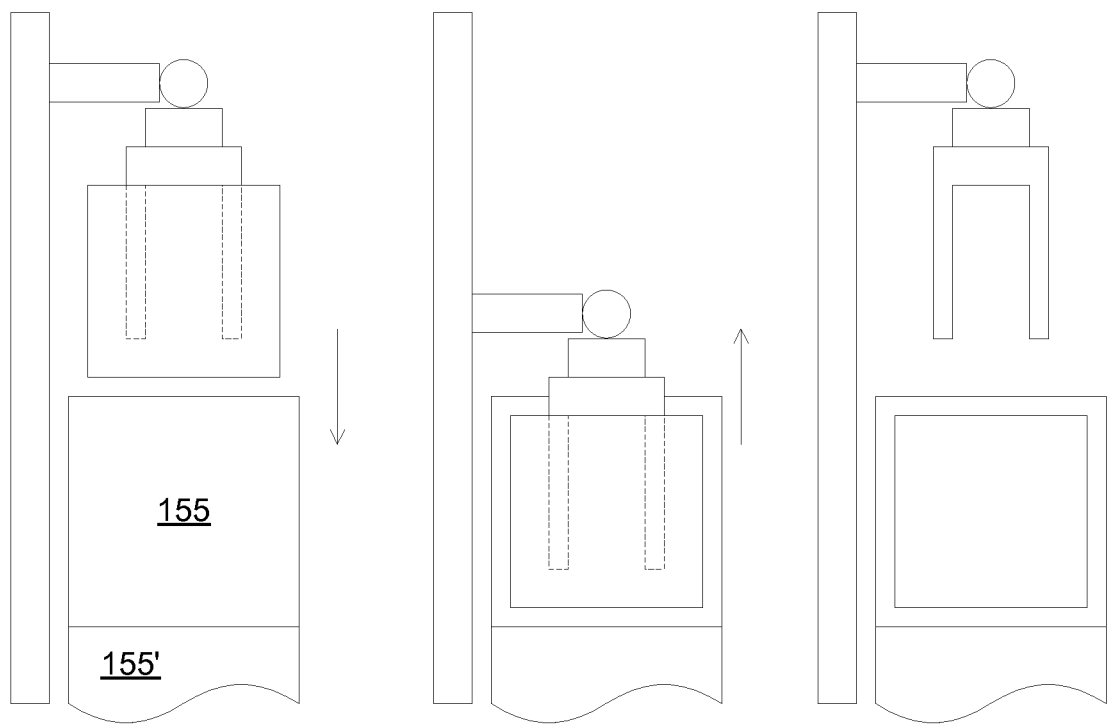
Fig. 15C  Fig. 15D  Fig. 15E

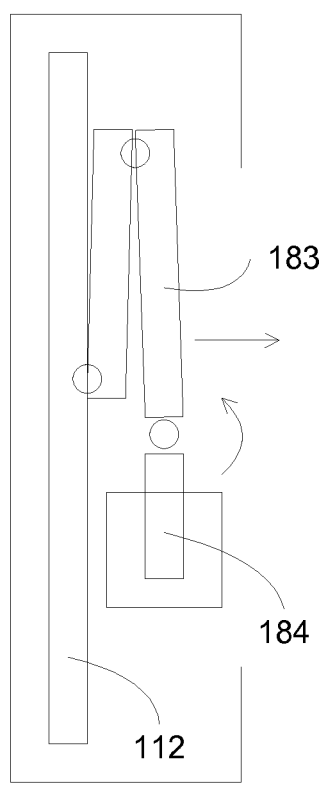 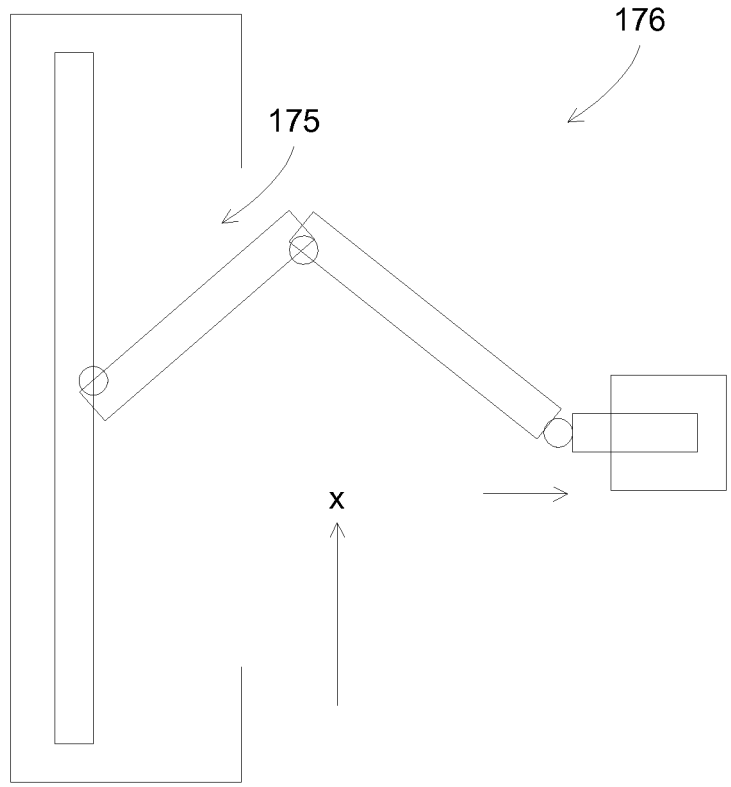
Fig. 18A          Fig. 18B
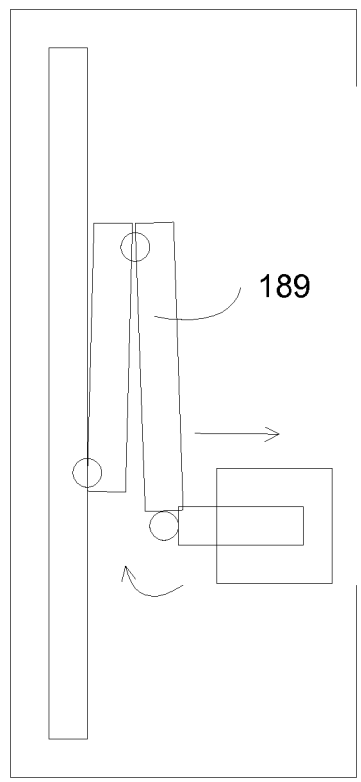 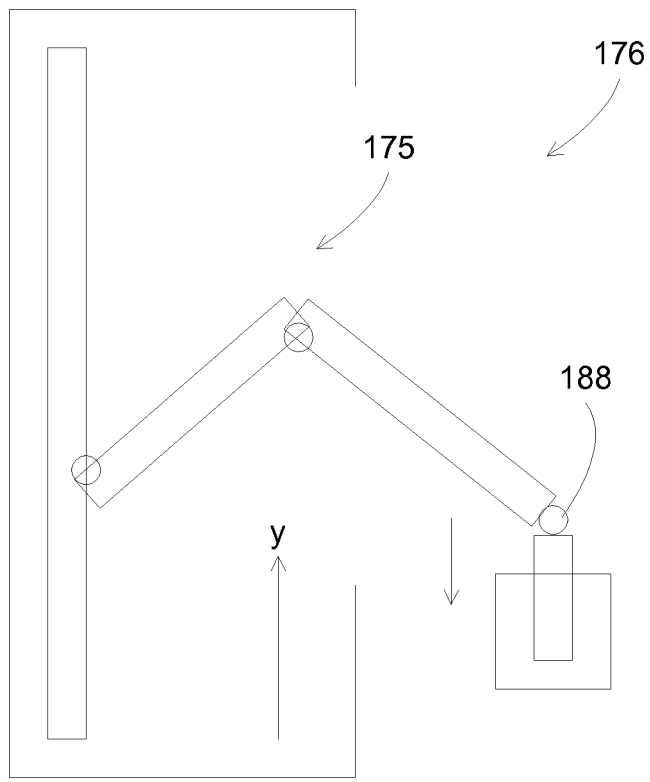
Fig. 18C          Fig. 18D

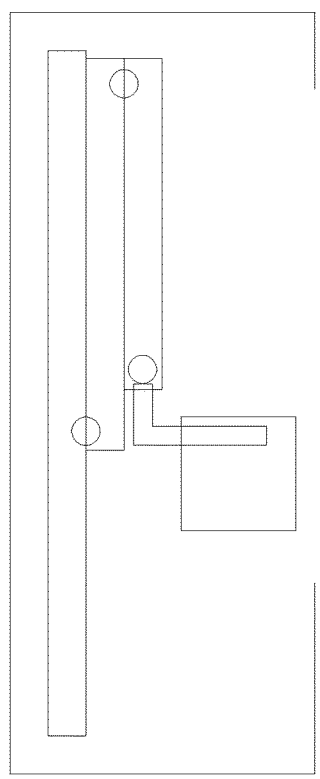
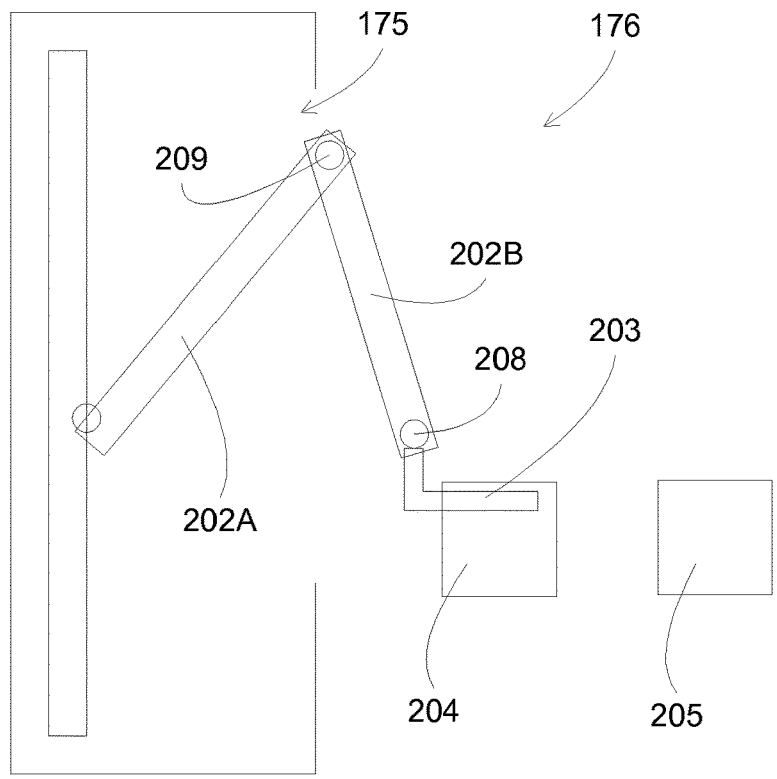
Fig. 20A     Fig. 20B
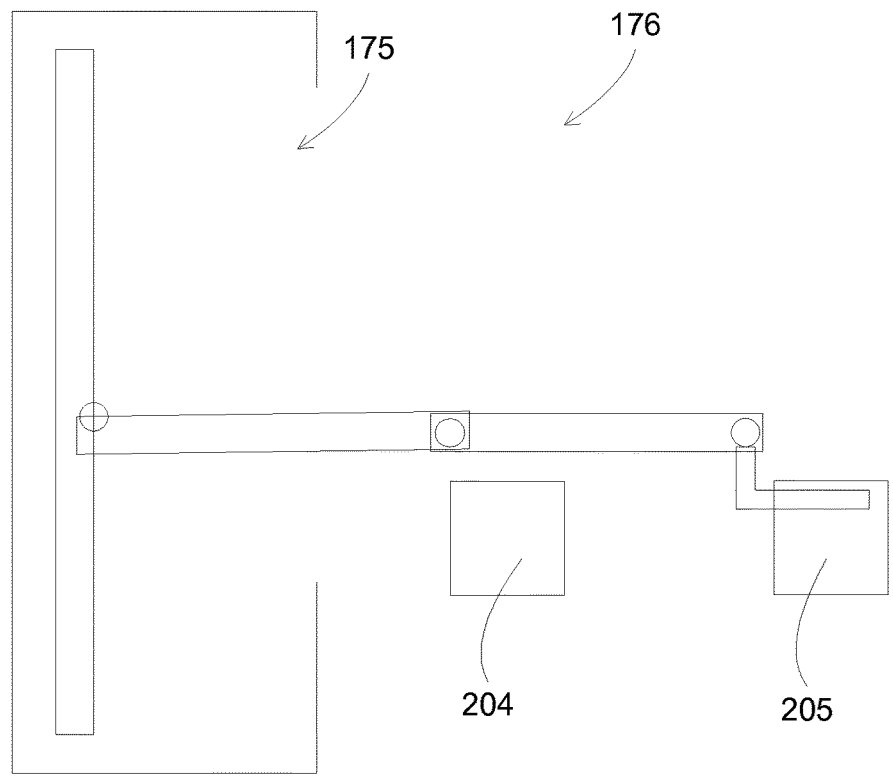
Fig. 20C

CONTAINER STORAGE ADD-ON FOR BARE WORKPIECE STOCKER

This patent application is continuation and claims priority from
(1) U.S. utility patent application Ser. No. 13/225,547, filed on Sep. 5, 2011, entitle "Container storage add-on for bare workpiece stocker", which is incorporated herein by preference.

FIELD OF THE INVENTION

The present invention relates to semiconductor equipment, and more particularly, to equipment and method to improve fabrication facility processing.

BACKGROUND

Stockers generally are installed within a semiconductor facility for temporarily storing workpieces, such as wafers, flat panel displays, LCD, photolithography reticles, or masks.

In the process of manufacturing semiconductor devices, LCD panels, and others, there are hundreds of processing equipments and thus hundreds of manufacturing steps. It is very difficult for the flow of the wafers, flat panels, or LCDs (hereafter workpiece) to be uniform from step to step, from tool to tool. Despite the best planners, there is always the unexpected scenario, such as a tool down, an emergency lot coming through, a periodic maintenance lasting longer than planned, thus there are various accumulations of the workpieces at certain steps for certain tools. The accumulated workpieces will need to be stored in a storage stocker, waiting to be processed.

Further, photolithography process is a critical process in the semiconductor fabrication facility, involving a large number of photolithography masks or reticles (hereinafter reticle). The reticles thus are typically stored in a storage stocker, and being retrieved when needed into the lithography exposure equipment.

The storage of workpieces and reticles (hereafter articles) is much more complicated due to the requirement of cleanliness. Damages to the articles can be physical damages in the form of particles, or chemical damages, in the form of interactions. With the critical dimension of the semiconductor device processing surpassing 0.1 micron, particles of 0.1 micron size, and reactive species will need to be prevented from approaching the articles. The storage areas typically would need to be even cleaner than the processing facility, to ensure less cleaning between processing.

Thus the stocker storage areas is typically designed to be sealed off from the outside environment, preferably with constant purging, and even with inert gas flow to prevent possible chemical reactions. Access to the storage areas is load-locked, to ensure isolation between the clean storage environment and the outside environment.

In a typical bare stocker system, a robot is typically used to remove the workpieces from the carrier boxes, and then loaded into a storage chamber, where the workpieces are stored without the original carrier boxes. For box stocker system, the workpieces are stored together with the carrier boxes, without the need for removing them out of the carrier boxes.

The carrier box is a protective container to minimize the substrate exposure to the environment outside of the processing machines and protect the substrate against particulate contamination. The carrier boxes are handled by an operator or by an automatic material handling system such as automatically guided or overhead transport vehicles that travel on predetermined routes, either on the ground or suspended on ceiling tracks. For semiconductor wafers, the carrier boxes are normally cassettes pods, such as SMIF (standard machine interface) or FOUP (front opening unified pod), which are handled by an operator at the tools equipment front end module (EFEM) or automatically picked up and placed in the automatic transport system.

One type of conventional transport system is an overhead transport (OHT) system, which comprises an OHT vehicle, which runs freely on a rail mounted on a ceiling. The OHT vehicle carries a cassette pod between facility equipment, such as processing systems and stockers. The OHT vehicle can load or unload a cassette pod onto a load port of the equipment, for example a MLP (Mobile Launch Platform) or an EFEM. From there, the cassette pod or the wafers can be transferred from or to the inside of the equipment.

SUMMARY

The present invention relates to buffer stations, serving as an add-on storage for an equipment, such as for a workpiece stocker. For example, the present buffer add-on storage can be used to store workpiece containers for a bare workpiece stocker.

In some embodiments, the present invention discloses systems and methods comprising a buffer storage assembly that can be added to an existing equipment to serve as an external storage. The buffer storage assembly comprises a storage chamber and a robot system interfacing with the storage chamber. The robot system can further access the loadlock stations (e.g., loading or unloading stations), or any intermediate station (such as a transfer station or an exchange station) of the equipment, to transfer objects between the storage chamber and a station of the equipment. For example, the buffer storage assembly can be installed adjacent to the equipment, at a side of the equipment and near the loadlock station of the equipment. The robot arm can be configured to reach into the loadlock station, to pick up a container from the loadlock station to bring to the storage chamber, or to place a container to the loadlock station taken from the storage chamber.

In some embodiments, the present invention discloses a buffer storage assembly to be coupled to a bare workpiece stocker, for example, to store and to supply empty containers to the bare workpiece stocker. The buffer storage assembly can also be used to store containers having workpieces stored therein.

In some embodiments, the buffer storage assembly can be used to store containers having workpieces stored within. The whole assembly of bare workpiece stocker and the buffer storage assembly can have the added functionality of bare workpiece storage and workpieces storage within containers, in addition to empty container storage capability.

In some embodiments, the present invention discloses a combination workpiece stocker comprising a bare workpiece stocker coupled to a buffer storage assembly. The buffer storage assembly can be separated from the bare workpiece stocker, and coupled only at the container transfer level. Alternatively, the buffer storage assembly can be fully integrated to the bare workpiece stocker, forming a complete system having multiple capabilities.

BRIEF DESCRIPTION OF THE DRAWINGS

FIGS. 1A-1C illustrate an exemplary configuration of a workpiece container add-on storage for a bare workpiece stocker.

FIGS. 9A-9D illustrate an exemplary sequence of container transfer to a storage location according to some embodiments of the present invention.

FIGS. 11A-11E illustrate an exemplary sequence of movable prongs for container transfer to a storage location according to some embodiments of the present invention.

FIGS. 13A-13I illustrate an exemplary sequence of movable gripper arms for container transfer to a storage location according to some embodiments of the present invention.

FIGS. 15A-15E illustrate an exemplary sequence of rotatable end handle for container transfer according to some embodiments of the present invention.

FIGS. 18A-18D illustrate exemplary configurations of a robot arm with rotatable end handle according to some embodiments of the present invention.

FIGS. 20A-20C illustrate an exemplary robot arm with bended end handle according to some embodiments of the present invention.

DETAILED DESCRIPTION OF THE PREFERRED EMBODIMENTS

Figures 2A, 2B:
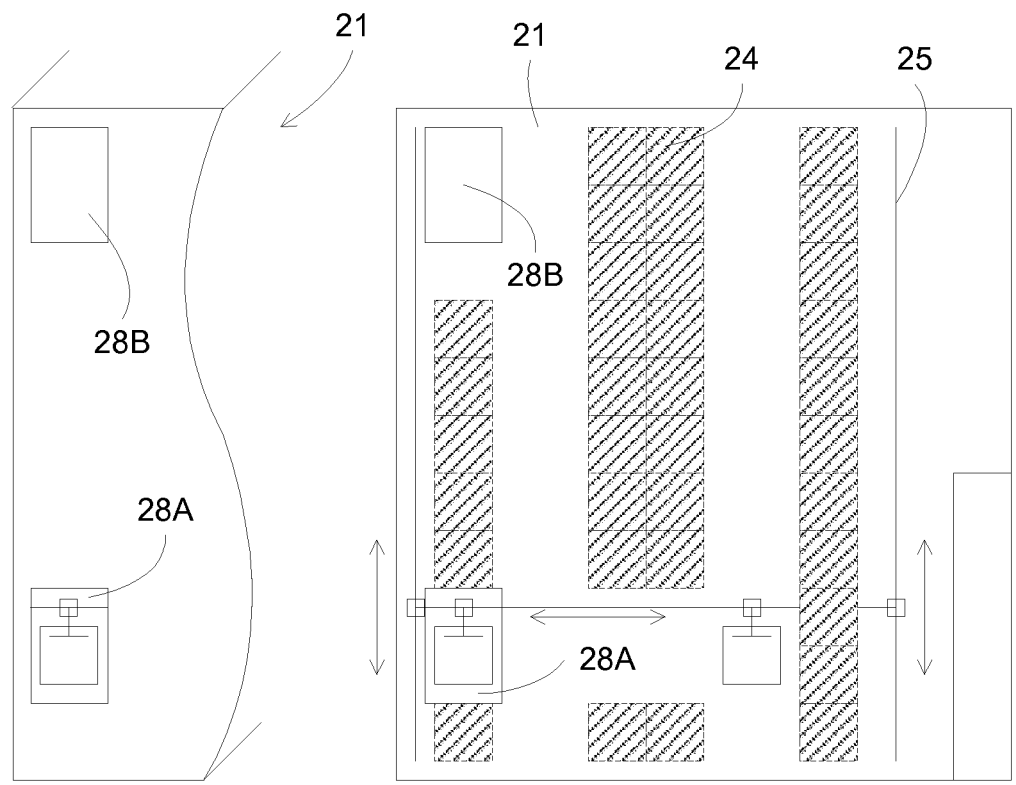
FIGS. 2A-2C illustrate details of an exemplary buffer add-on storage assembly according to some embodiments of the present invention.

The present invention relates to buffer stations, serving as an add-on storage for an equipment, such as for a workpiece stocker. In some embodiments, the present invention discloses systems and methods for a buffer storage assembly that can be added to an existing equipment to serve as an external storage. The buffer storage assembly comprises a storage chamber and a robot system interfacing with the storage chamber. The robot system can further access the loadlock stations (e.g., loading or unloading stations), or any intermediate station (such as a transfer station or an exchange station) of the equipment, to transfer objects between the storage chamber and a station of the equipment. For example, the buffer storage assembly can be installed adjacent to the equipment, at a side of the equipment and near the loadlock station of the equipment. The robot arm can be configured to reach into the loadlock station, to pick up a container from the loadlock station to bring to the storage chamber, or to place a container to the loadlock station taken from the storage chamber.

In some embodiments, the present buffer add-on storage can be used to store workpiece containers for a bare workpiece stocker. In bare workpiece stockers, the workpieces are removed from the containers to be stored bare in the stocker storage. The containers are located elsewhere, for example, re-used for other workpieces, or re-cleaned to return to storage. Thus when workpieces are needed from the bare stocker, a new container must be supplied. The present buffer add-on storage offers a means to store and supply containers, without a need to go search for an empty container.

FIGS. 1A-1C illustrate an exemplary configuration of a workpiece container add-on storage for a bare workpiece stocker. The description of the present specification describes a workpiece container add-on storage for a bare workpiece stocker, but the present invention is not so limited, and can be used as an add-on storage assembly for any system, such as an external workpiece add-on storage for a workpiece stocker, or a workpiece add-on storage for a processing equipment.

In FIG. 1A, a workpiece container add-on storage 11 is coupled to a bare workpiece stocker 12 having loading stations 13. The term loading station is used in the context of the present invention as a station supporting a workpiece container, for example, a manual I/O station (e.g., station for loading to and unloading workpiece containers from the workpiece stocker 12 by an operator), an automatic I/O station (e.g., station for loading to and unloading workpiece containers from the workpiece stocker 12 by an automatic overhead transport system), or an intermediate or an interface station within the workpiece stocker 12, serving to support a workpiece container as a transitioning station between the I/O station and the workpiece stocker system. For example, a container can be loaded to the I/O station (manual or automatic), and then transferred to an intermediate station, where the container is open for a robot to access the workpiece within.

In some embodiments, the bare workpiece stocker 12 is a stand alone workpiece stocker, capable of independent operation, with manual or automatic I/O stations for interfacing with other equipment in a fabrication facility. The bare workpiece stocker accepts containers having workpieces stored within, stores only the bare workpieces in its bare workpiece storage chamber, and ignores the workpiece containers. The workpiece container add-on storage 11 can be affixed to a side of the workpiece stocker, acting as an external storage for the workpiece stocker. The coupling between the workpiece container add-on 11 and the workpiece stocker 12 preferably comprises mating a robot arm of the container add-on storage 11 with the loading stations 13 of the workpiece stocker 12, so that the container add-on storage 11 can access the containers in the loading stations 13, for example, to pick up a container in the loading station 13 to store in a storage chamber of the container add-on assembly 11, or to place a container to the loading station 13 from a storage chamber of the container add-on assembly 11.

In an exemplary process flow, a container is bought to the workpiece stocker 12, and the workpieces within the container are removed and stored in the workpiece stocker 12. The robot of the container add-on storage then picks up the container (either completely empty or partially empty) and stores it in the container storage chamber of the container add-on storage 11. In some embodiments, the robot can pick up the container with all the workpieces within, before the workpiece stocker accessing the workpieces, and stores the full container in its container storage chamber. For example, in this capacity, the container add-on storage 11 can serve as an input buffer station for the workpiece stocker, allowing the workpiece stocker to accept multiple containers in a very short time, and slowly retrieving the workpieces to the bare storage chamber.

For example, after receiving a number of full containers and storing in the container storage, the robot can retrieve the full containers, one at a time, back to the loading station 13 and allow the workpiece stocker to retrieve the workpieces within the container to be stored in the bare storage chamber. The empty container is then picked up by the robot, and re-stored in the container storage chamber. Another full container is then transferred from the container storage to the loading station. The process continues until all the workpieces in the number of full containers are transferred to the bare workpiece storage chamber, and the empty containers are stored in the container storage chamber.

Alternatively, the container storage chamber can served as an output buffer for the workpiece stocker. For example, a number of workpieces can be transferred to a number of containers and stored in the container storage chamber, ahead of being needed. For example, a controller can decide the workpieces to be needed in the next 6, 8, 10 or 24 hours, and then assemble the workpieces within the appropriate containers, and store the full containers in the container storage chamber. When needed, the full containers are ready to be transferred, without waiting for the assembling of the workpieces to the containers.

Further, with the container storage add-on 11 storing empty container, automatic assembling or disassembling of workpieces to workpiece containers can be performed, allowing faster throughput. For example, automatic assembling or dissembling of workpieces from workpiece containers can be performed with one operation (e.g., bringing a full container to the workpiece stocker), instead of two operations (e.g., plus removing the empty container).

FIGS. 1B and 1C show a top view and a front view, respectively, of the add-on storage 11 affixed to a workpiece stocker 12. Workpiece stocker 12 comprises manual I/O stations 13 for accepting containers, a storage chamber 16, such as a bare workpiece storage chamber, and a robot 18 to transfer workpieces between the I/O stations 13 and the storage chamber 16. Additional stations can be included, such as automatic overhead I/O station 19 for coupling with automatic overhead transport system, and intermediate station 13A, which can serve as an interface station for container or for workpiece. For example, a container in I/O station 13 can be brought to the interface station 13A, where its lid can be open, and the workpieces accessed by the robot 18. Alternatively, a workpiece in a container in I/O station 13 can be brought to the interface station 13A (e.g., by the robot 18), before being transferred to the storage chamber 16. The interface station can allow workpiece alignment, or changing workpiece orientation, such as from a horizontal support by an end effector to a vertical grip by a gripper of the robot 18. A controller 17B is preferably included, containing information and instructions to operate the workpiece stocker. For example, the controller can be coupled to communication module and sensors (such as location sensors, temperature sensors, gas flow sensors, electrical sensors, failure sensors, etc.), meter (such as temperature meter, gas flow meter, electrical meter, failure meter, pressure meter, impurity meter, etc.), and commands (such as motor commands, pneumatic commands, hydraulic commands, flow commands, vacuum commands, power commands, etc.). The controller can comprise software program to determining operation sequence. For example, the controller can retrieve gather information on the workpieces to be needed in the next 24 hours or so through communication with a central computer of the fabrication facility, and can determine the needed actions, for example, by assembling the needed workpieces in appropriate containers ahead of time. The controller can determine the empty storage locations in the storage chamber, to know where to put the workpieces. The controller can know the locations of the stored workpieces, to enable retrieving the needed workpieces.

Add-on storage assembly 11 comprises a robot assembly 15 and a plurality of shelves 14 for storing workpiece containers. Robot assembly 15 is configured to access the containers in shelves 14 and also in loading stations 13 and 13A of the workpiece stocker 12. For example, robot assembly 15 can comprise an x-y linear guide to access the shelves 14 disposed in x-y locations, and an extendable robot arm to access containers in outside loading stations 13 and 13A. Add-on storage assembly 11 also comprises a controller 17A for controlling its operations. The controller 17A can comprise similar functions as controller 17B of the workpiece stocker 12. The controller 17A can communicate with controller 17B to get the information, or can communicate with the facility computer.

Figure 2C:
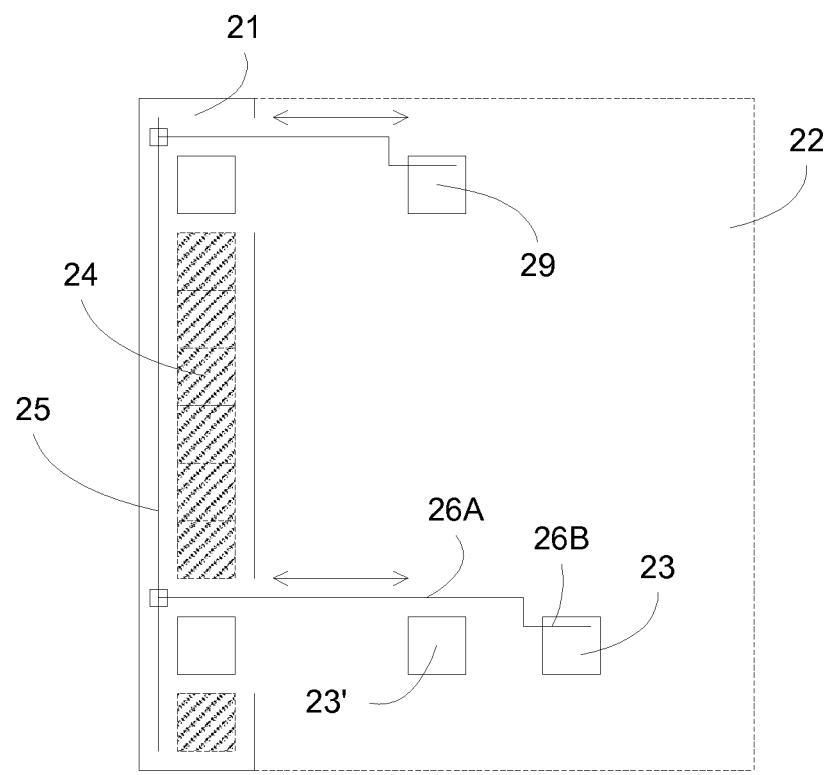

FIGS. 2A-2C illustrate details of an exemplary buffer add-on storage assembly according to some embodiments of the present invention. In FIG. 2A, buffer add-on storage 21 comprises opening 28A and 28B for coupling with a workpiece stocker 22. For example, opening 28A allows access to manual loading stations 23 and 23', and opening 28B allows access to automatic overhead loading station 29. FIG. 2B shows a cross section side view of the buffer add-on storage 21, showing openings 28A and 28B. The containers 24 are arranged in arrays, accessed by a linear guide robot assembly 25. There are transport pathways between the containers arrays to allow passage of a container transported by the robot assembly 25. FIG. 2C shows a cross section front view of the buffer add-on storage 21, in addition to some components of the workpiece stocker 22, such as the manual loading stations 23 and 23' and the overhead loading station 29. Robot assembly 25 comprises a robot arm 26A having an end handle 26B. The end handler 26B can comprise a bend section, making the end handler 26B positioned at a different plane than the robot arm 26A. For this design, the robot arm 26A can bypass a closer manual loading station 23' to pick up or place a container to a farther manual loading station 23. As shown, the buffer add-on storage 21 comprises one layer of storage containers to minimize the foot print. Alternatively, any number of storage layers can be used.

In some embodiments, the storage compartments are arranged in one or more x-y arrays with transport pathways between compartments to allow workpiece transport. Each storage compartment has at least one side facing a transport pathway, allowing a workpiece to be taken out to, or brought in from, a transport pathway. The transport pathways are sufficiently large to accommodate the movements of the workpieces, such as moving between compartments (after the workpieces have been taken out of the compartments to the transport pathways), or moving to or from an outside station. The transport pathways are connected to enable a workpiece to travel to any storage compartment or vice versa. For example, the transport pathways can comprise a horizontal pathway across the length of the buffer storage assembly, and multiple vertical pathways across the height of the buffer storage assembly. A workpiece can travel along the horizontal pathway, and turn to a vertical pathway to reach the destination compartment.

Figure 3:
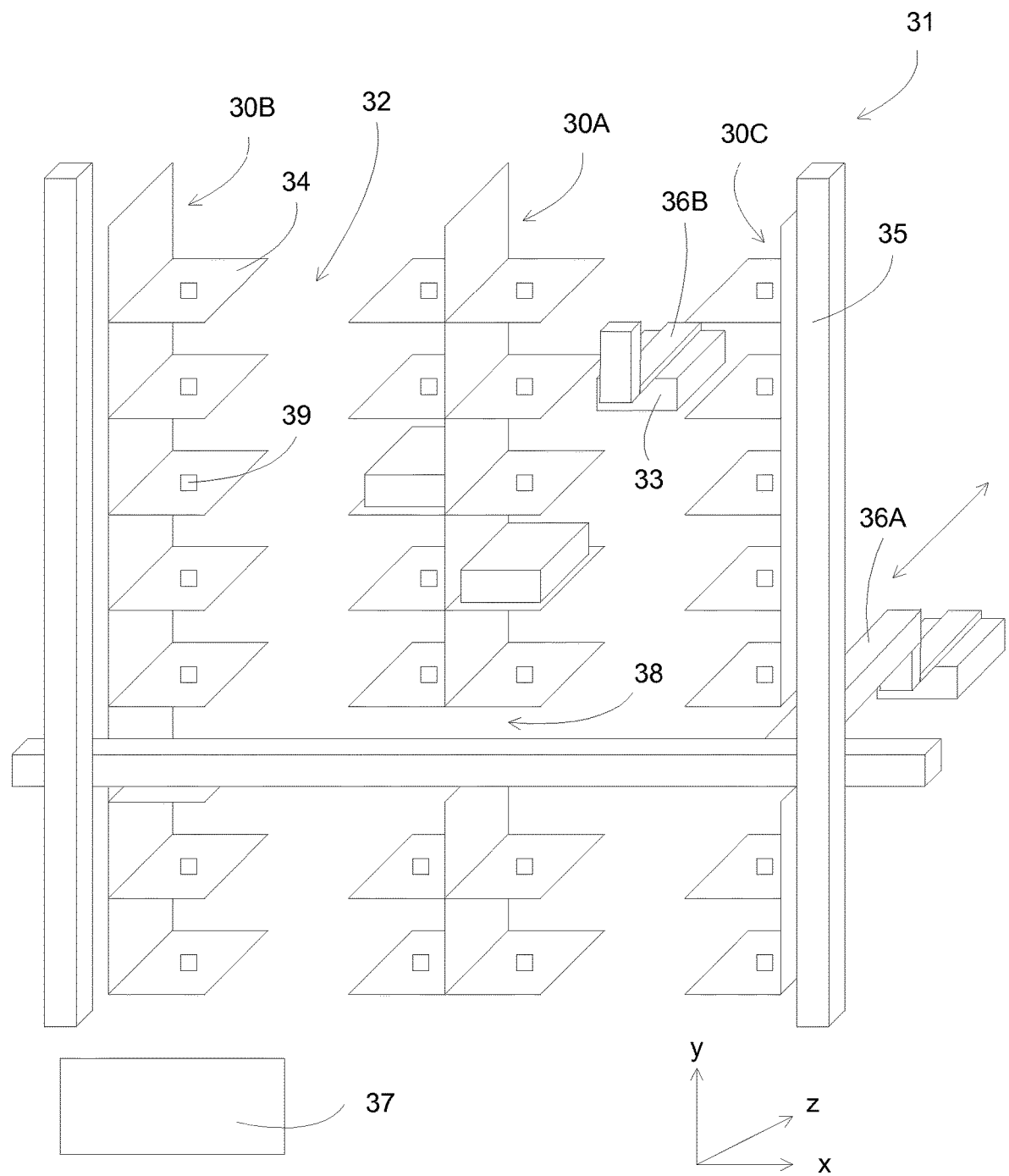
FIG. 3 illustrates a perspective view of an exemplary buffer add-on storage assembly according to some embodiments of the present invention.

FIG. 3 illustrates a perspective view of an exemplary buffer add-on storage assembly according to some embodiments of the present invention. The buffer assembly 31 is shown without outside walls to better illustrate the inner components. A plurality of shelves 34 are arranged in arrays 30A-30C for storing containers 33 (or workpieces). Sensors 39 can be disposed at the storage shelves to detect the presence of the containers 33. The shelves 34 and arrays 30A-30C are arranged between transport pathways 32 and 38, which are configured to transport a container to the shelves. The arrays 30A-30C are preferably arranged so that each shelf 34 has a side facing a transport pathway, thus allowing a robot to move a container along the transport pathway to the shelf locations. For example, the array 30A is disposed by two columns, with each column facing a vertical y transport pathway 32. The arrays 30B and 30C at the edge of the buffer storage assembly can be facing a wall, and can be disposed in one-column arrays. A horizontal transport pathway 38 can be included, running along the horizontal x direction of the buffer storage. The horizontal pathway 38 can stop at a last vertical column shelf array 30B, or can pass through a last vertical column shelf array 30C.

A robot assembly 35 comprises x-y linear guides can be disposed next to the array storage to move a robot arm 36A along the transport pathways 32 and 38 to the shelves 34. Robot arm 36A can comprise an end handle 36B for handling a container 33. Robot arm 36A can extend to the workpiece stocker in the z direction to pick up or place a container with a loading station of the stocker. A controller 37 can control the movements of the robot assembly 35, transferring containers between the storage shelves 34 and the workpiece stocker. Controller 37 can comprise other functions, such as the functions described above for operating the buffer storage assembly.

Figure 4A:
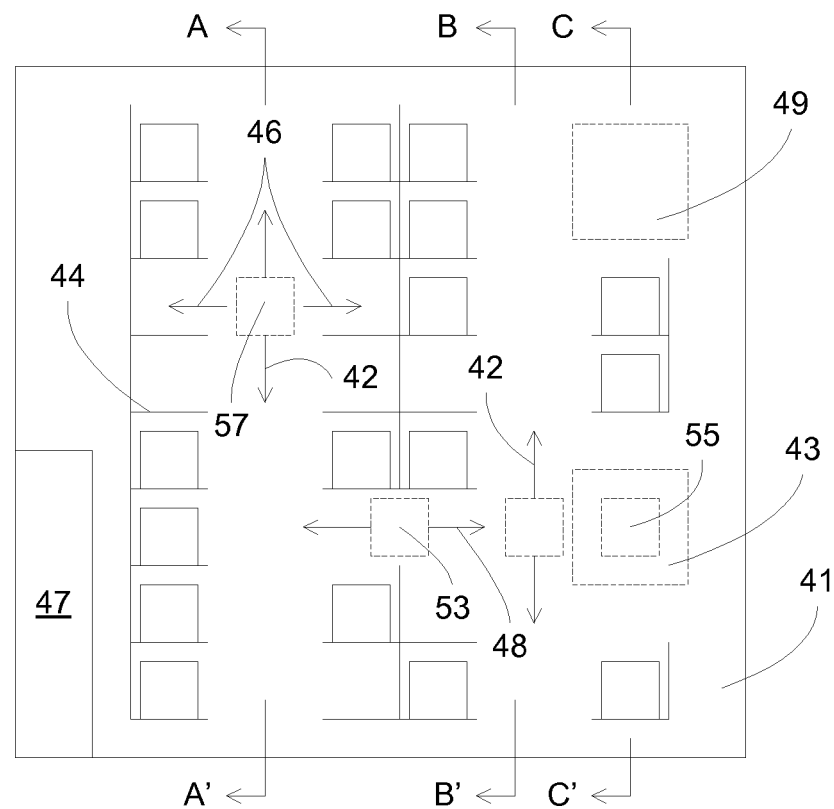
FIGS. 4A-4B illustrate exemplary buffer add-on storage assemblies according to some embodiments of the present invention.
Figure 4B:
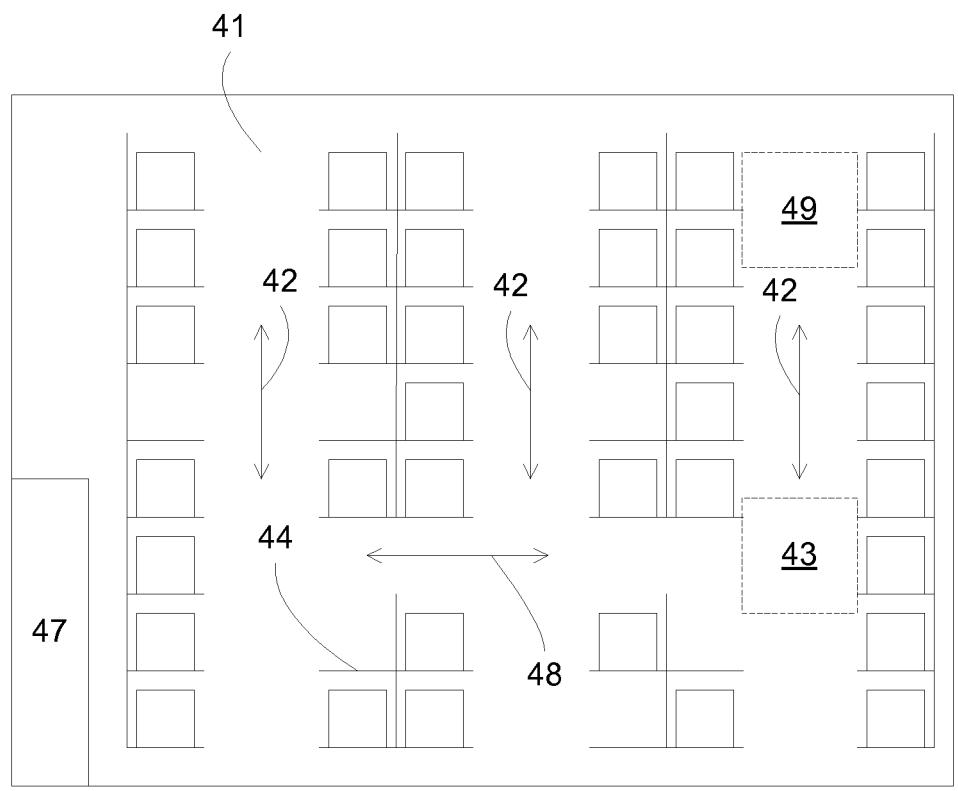

FIGS. 4A-4B illustrate exemplary buffer add-on storage assemblies according to some embodiments of the present invention. Containers 55 are stored in shelves 44 of buffer storage 41, which are arranged in arrays with transport pathways in between. Buffer storage 41 comprises transfer locations 43 for connecting with manual loading stations of a workpiece stocker, and transfer location 49 for connecting with an automatic overhead loading station of the workpiece stocker. Container 55 can be moved to transfer station 43 to be transfer to the stocker. Container 57 can travel 42 in vertical transport pathway, or can move 46 to storage shelves. Container 53 can travel 48 in horizontal transport pathway, connected to vertical transport pathway to reach shelf locations. Controller 47 operates the buffer storage assembly, controlling the movements of the robot.

In some embodiments, the buffer storage assembly is configured to occupy minimum floor space, with the storage capacity remaining a secondary consideration. The buffer storage assembly dimensions can comprise a length (e.g., along an x direction) and a height (e.g., along a y direction) matching those of one side of the existing equipment, so that the buffer storage assembly can be attached to that side. In some embodiments, the buffer storage assembly comprises a minimum width (e.g., along a z direction), storing one layer of storage compartments, with a width wide enough to accommodate a workpiece and an x-y movement mechanism.

Figure 5A:
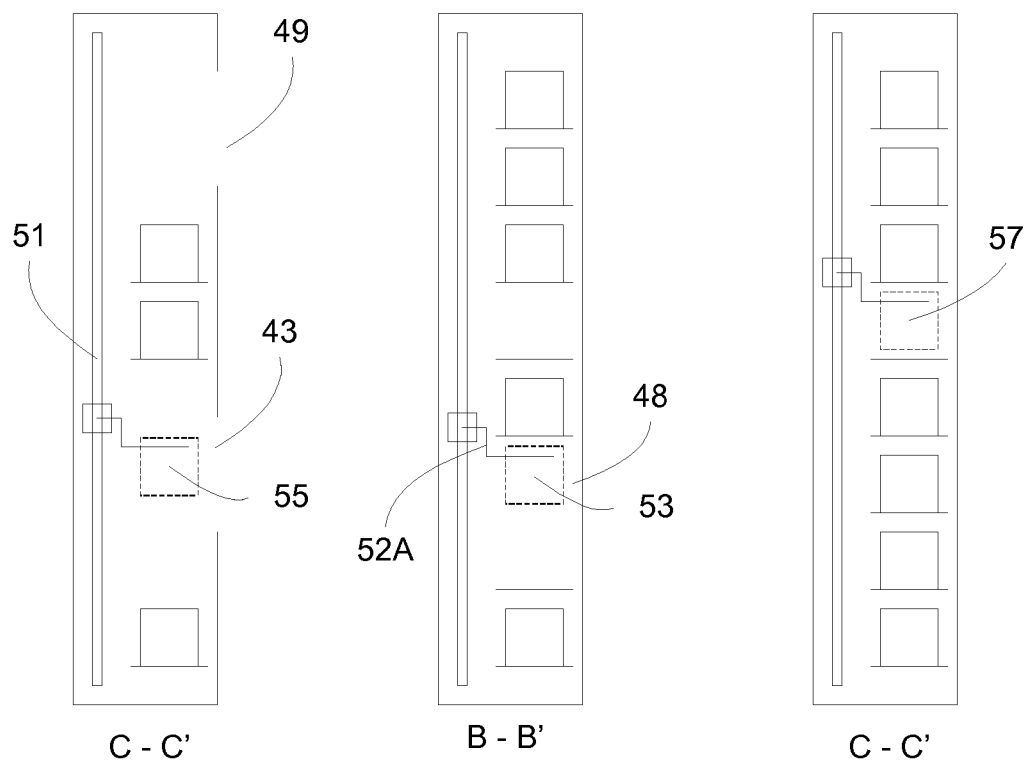
FIGS. 5A-5B illustrate exemplary configurations of buffer storage according to some embodiments of the present invention.
Figure 5B:
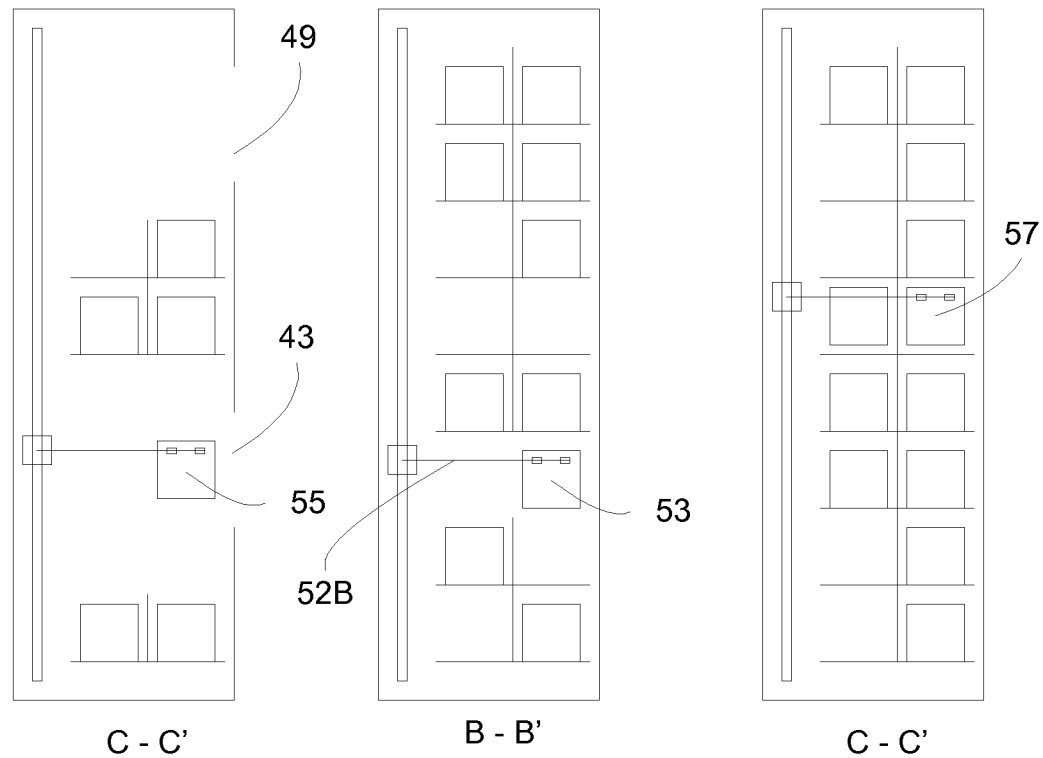

FIGS. 5A-5B illustrate exemplary configurations of buffer storage according to some embodiments of the present invention. FIG. 5A shows a buffer storage assembly with one layer of storage, providing a minimum configuration to be affixed to a stocker. The container 55, 53 or 57 can travel at a same width as the stored containers, thus minimum width can be achieved. A robot 51 is disposed next the storage arrays, moving robot arm 52A or 52B which supports a container 53, 55 or 57. Robot arm 52A has an end handle bended to a different plane, which can allow moving around obstacle. Robot arm 52B has end handle directly connected to the arm, for accessing station closest to the robot.

In some embodiments, the buffer storage assembly further comprises an x-y movement mechanism coupled to the storage chamber. The x-y movement mechanism can reach the storage compartments, allowing moving a workpiece to and from a workpiece storage compartment. The x-y movement mechanism can comprise an x-y linear guide, capable of moving a workpiece along an x (e.g., along the length of the buffer storage assembly) and along a y direction (e.g., along the height of the buffer storage assembly). In some embodiments, a robot system can be coupled to the x-y movement mechanism to move a robot arm supporting a workpiece.

Figure 6A:
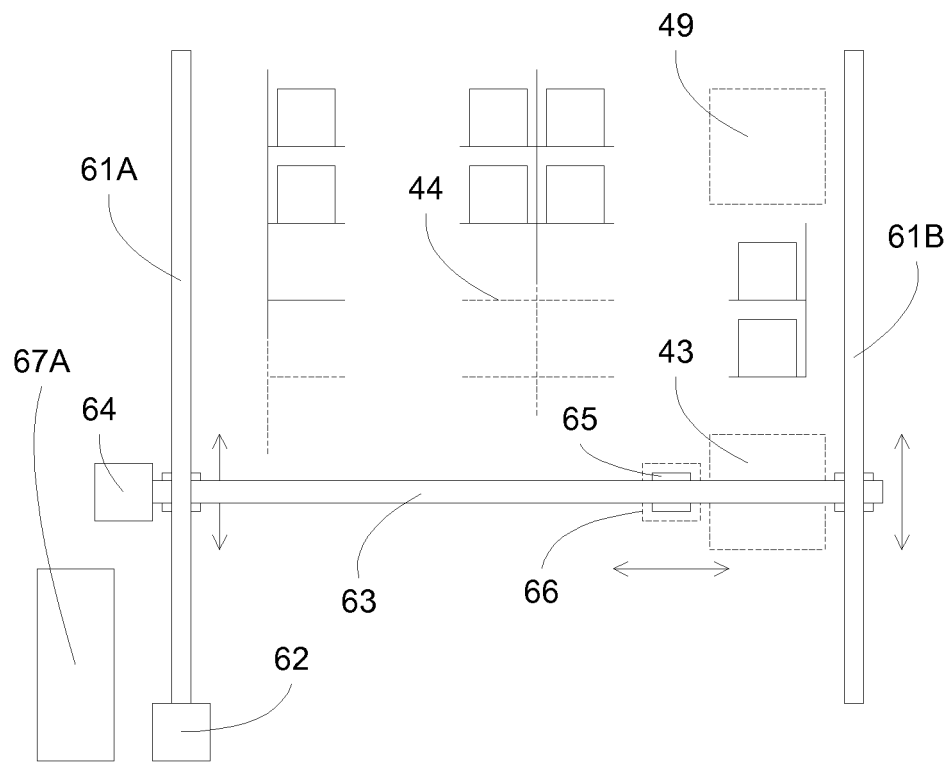
FIGS. 6A-6B illustrate exemplary configurations for x-y movement mechanism according to some embodiments of the present invention.
Figure 6B:
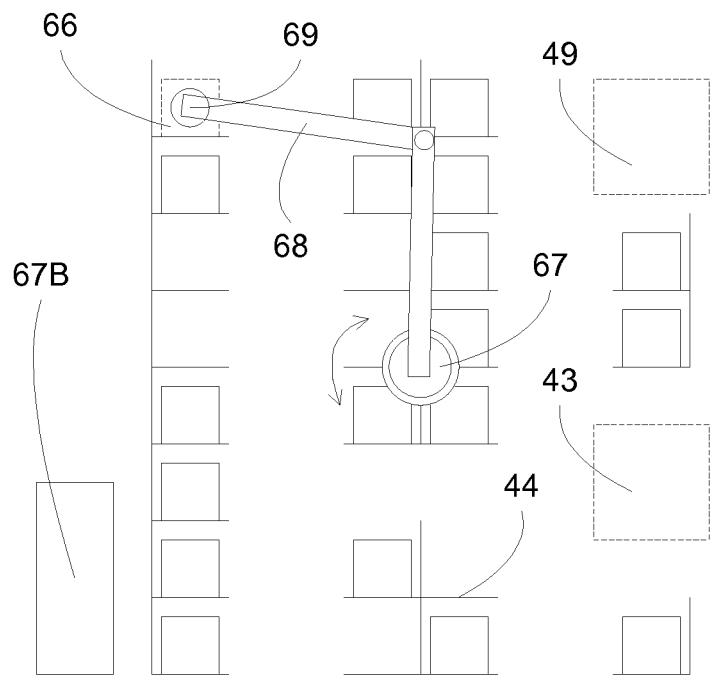

FIGS. 6A-6B illustrate exemplary configurations for x-y movement mechanism according to some embodiments of the present invention. FIG. 6A shows vertical linear guides 61A, 61B supporting a horizontal linear guide 63, which moves vertically through motor 62. Robot connection 65 is coupled to the horizontal linear guide 63, and moves horizontally through motor 64, carrying container 66. Controller 67A controls the movements of the linear guides, for example, through the motors 62 and 64.

FIG. 6B shows a robot 67 moving a robot arm 68, which is connected to a robot connection 69 for supporting container 66. By rotating the robot arm 68, the container 66 can be moved between any locations in the buffer storage assembly, for example, between transfer locations 43 and 49 to any storage shelves 44. Controller 67B controls the movements of the robot 67, for example, through motors within the robot for rotating the robot arm 68.

In some embodiments, the robot system comprises an end handle to support a workpiece. The end handle can comprise an end blade, an end effector, or one or more forks, which, upon entering a recess in the workpiece, can be lifted up to move the workpiece out of the storage compartment (or out of a station of the equipment). Operations for placing a workpiece are reverse, comprising the robot to lower the forks to place the workpiece on a support pedestal, and then the forks withdrawn.

Figure 7A:
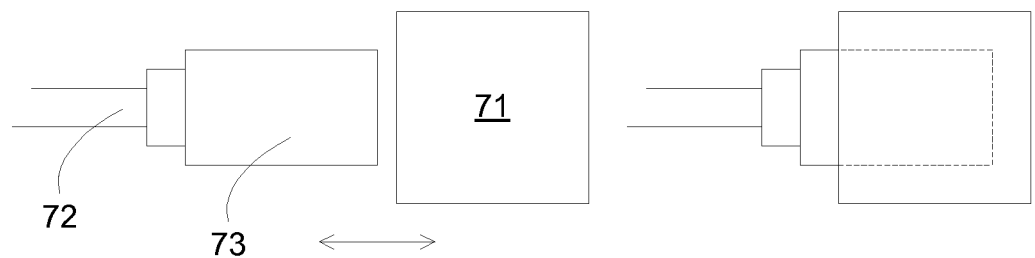
FIGS. 7A-7C illustrate exemplary sequences of end handle movements according to some embodiments of the present invention.
Figure 7B:
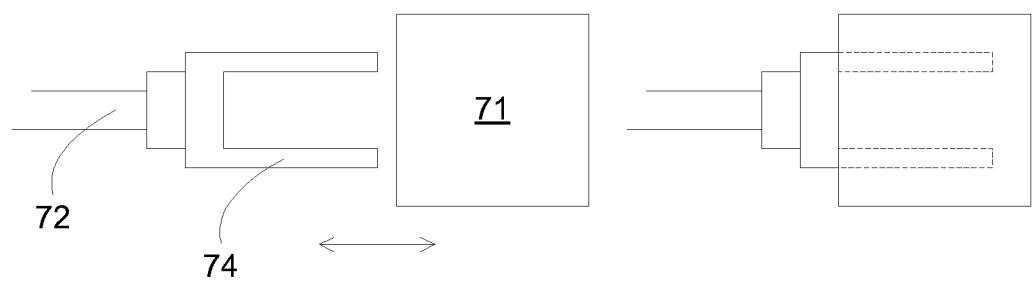
Figure 7C:
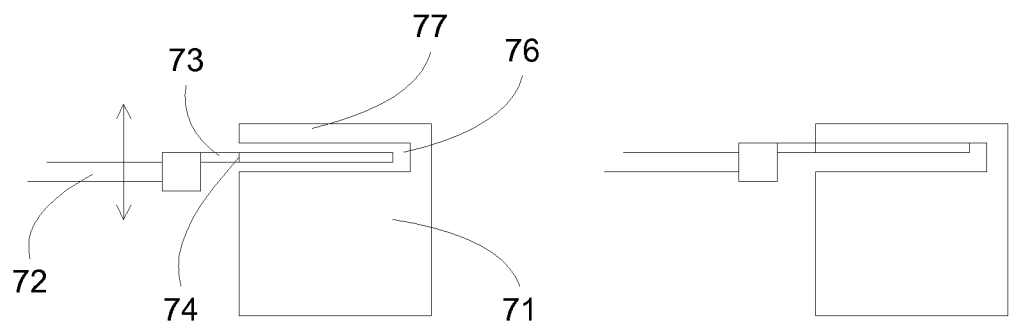

FIGS. 7A-7C illustrate exemplary sequences of end handle movements according to some embodiments of the present invention. In FIG. 7A, a robot arm 72 having an end handle in the form of a blade or end effector 73 coupled to an end of the robot arm for supporting a container 71 (or workpiece). Upon entering the container 71, for example, through a recess in the container, the arm 72 can raise up, lifting the container out of its support pedestal. The robot arm then can move the container to a storage location. And upon lowering the robot arm until the end handle is free of the recess, the robot arm can withdrawn. In FIG. 7B, robot arm 72 having an end handle in the form of two forks 74 coupled to an end of the robot arm for supporting a container 71 (or workpiece). Upon entering the container 71, for example, through a recess in the container, the arm 72 can raise up, lifting the container out of its support pedestal. The robot arm then can move the container to a storage location. And upon lowering the robot arm until the end handle is free of the recess, the robot arm can withdrawn. In FIG. 7C, a side view of the operation is shown, where the end handle 73 or 74 enters recess 76 of container 71. Upon lifting, the end handle contacts the top portion 77 of the recess. The robot can support the container by the top portion 77, and can move the container by the movements of the robot arm.

In some embodiments, the end handle can enter the workpiece from multiple directions, thus allowing flexibility in picking or placing a workpiece. For example, the end handle can enter the workpiece from a z direction at a loadlock station, then leaving the workpiece at a +x or −x direction at a storage compartment.

Figure 8A:
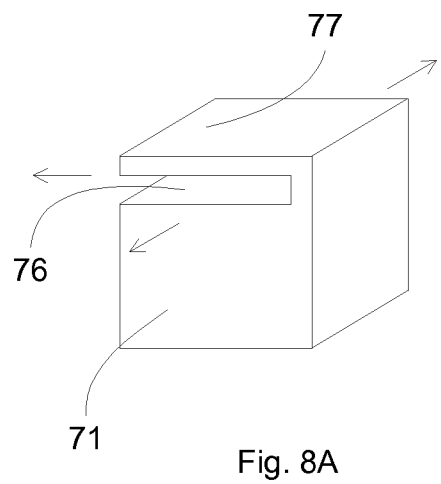
FIGS. 8A-8B illustrate an exemplary container and exemplary movements of an end handle according to some embodiments of the present invention.
Figure 8B:
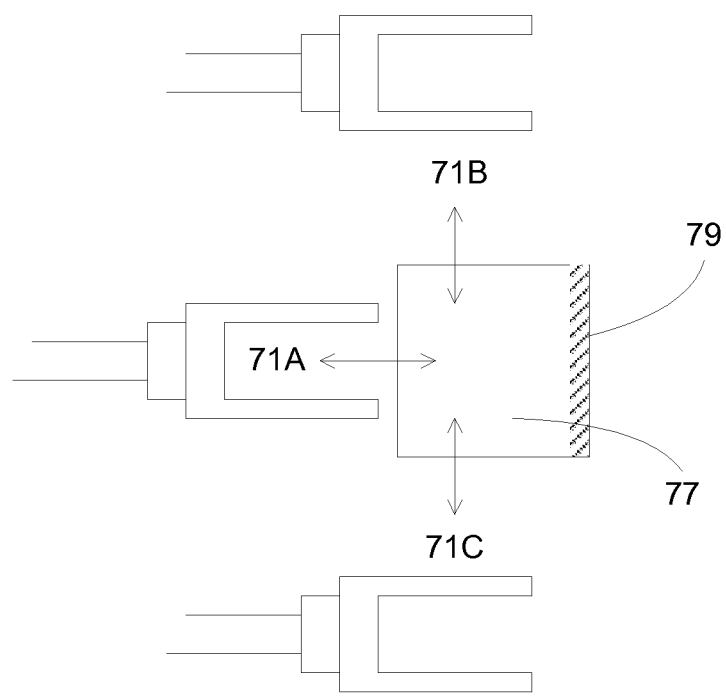

FIGS. 8A-8B illustrate an exemplary container and exemplary movements of an end handle according to some embodiments of the present invention. An exemplary container 71 is shown, comprising a top portion 77 connected to the container body at one side 79 to form recess 76. Three other sides of the recess 76 are open, allowing an end handle to enter and exit the recess 76.

FIGS. 9A-9D illustrate an exemplary sequence of container transfer to a storage location according to some embodiments of the present invention. A robot arm 94 is coupled to an x-y movement mechanism 92 for moving to different locations. The robot arm 94 can be extended to access container 71 in a workpiece stocker. In FIG. 9A, the robot arm 94 is extended until the end handle 93 enters a recess in the container 71. The end handle enters the container from a front side 71A. In FIG. 9B, the robot arm 94 retracts, returning the robot to the buffer storage assembly. In FIG. 9C, the x-y mechanism 92 moves the robot carrying the container 71 to the shelf 95. Afterward, the x-y mechanism 92 lowers the container 71 to the shelf 95. In FIG. 9D, x-y mechanism 92 moves the robot end handle out of the container from a side 71B. Alternatively, for other shelf 95', the robot can approach the shelf 95' from another direction, and the end handle is moved out of the container from another side 71C. Container can be retrieved from storage shelves by reverse operation.

Figure 10A:
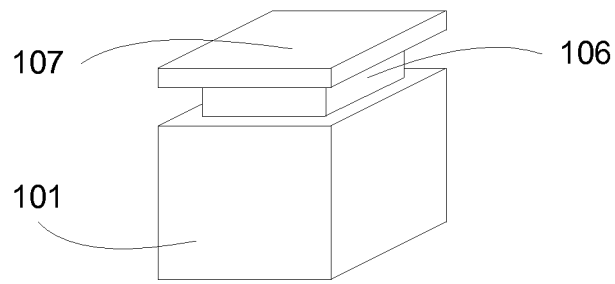
FIGS. 10A-10D illustrate an exemplary movement sequence of robot having movable prongs according to some embodiments of the present invention.
Figure 10B:
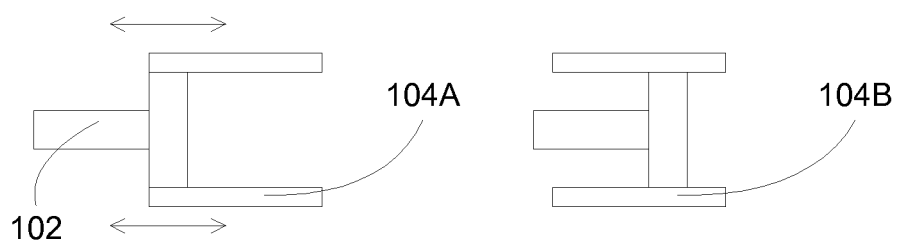
Figure 10C:
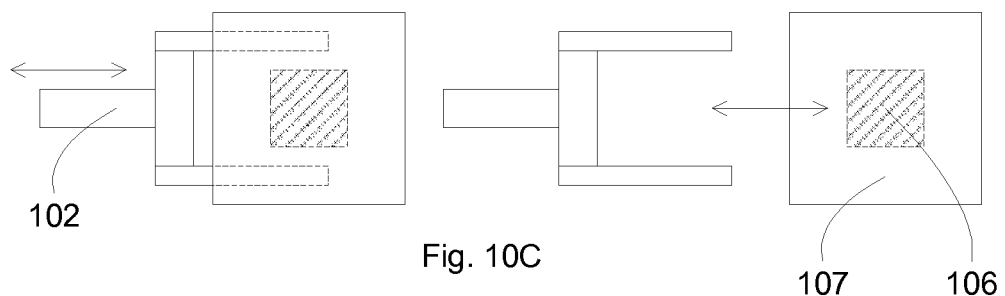
Figure 10D:
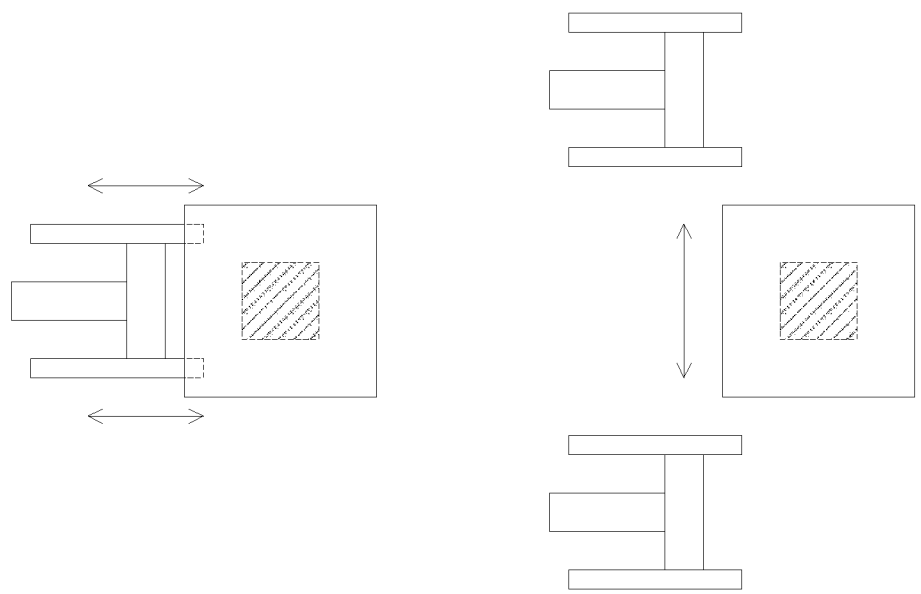

In some embodiments, the end handle can have movable prongs to allow the movements of the end handle in or out of the container. FIGS. 10A-10D illustrate an exemplary movement sequence of robot having movable prongs according to some embodiments of the present invention. FIG. 10A shows an exemplary container 101 having a top portion 107 connected to a body through a connector portion 106. FIG. 10B shows a robot arm 102 having an end handle having movable prongs that can be extended 104A and retracted 104B. In FIG. 10C, the robot can enter and return from a container 101 from a same direction. In FIG. 10D, after entering the container from a front direction, the prongs are retracted, and the robot arm can move out of the container from either side of the container.

FIGS. 11A-11E illustrate an exemplary sequence of movable prongs for container transfer to a storage location according to some embodiments of the present invention. A robot arm 114 is coupled to an x-y movement mechanism 112 for moving to different locations. The robot arm 114 can be extended to access container 107 in a workpiece stocker. In FIG. 11A, the robot arm 94 is extended until the end handle 113 enters the container 101 around the connector portion 106. The end handle enters the container from a front side. In FIG. 11B, the robot arm 114 retracts, returning the robot to the buffer storage assembly. In FIG. 11C, the x-y mechanism 112 moves the robot carrying the container 101 to the shelf 115. Afterward, the x-y mechanism 112 lowers the container 101 to the shelf 115. In FIG. 11D, the prongs of the end handle retract to allow the robot to move out of the container. In FIG. 11E, x-y mechanism 112 moves the robot end handle out of the container from a side. Alternatively, for other shelf 115', the robot can approach the shelf 115' from another direction, and the end handle is moved out of the container from another side. Container can be retrieved from storage shelves by reverse operation.

Figure 12A:
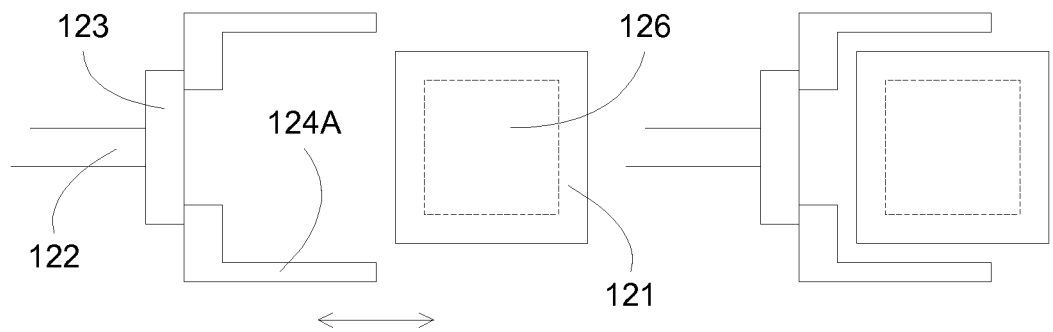
FIGS. 12A-12C illustrate an exemplary movement sequence of robot having gripper arms according to some embodiments of the present invention.
Figure 12B:
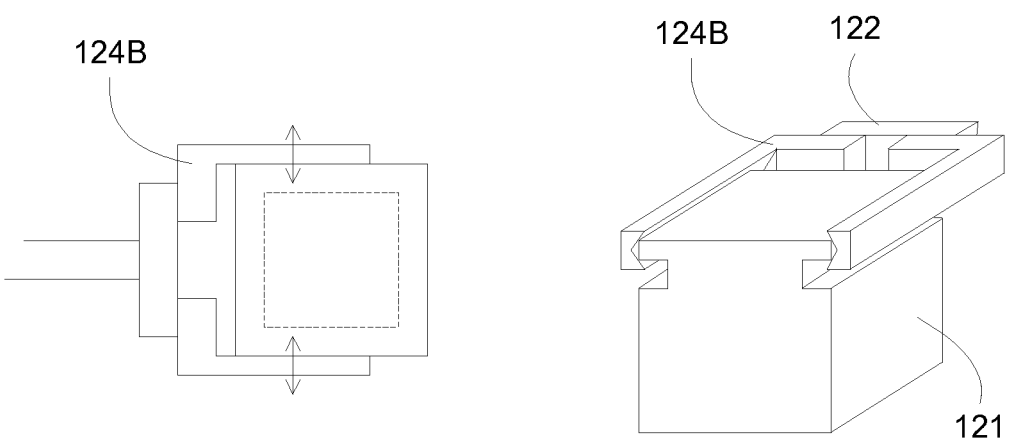
Figure 12C:
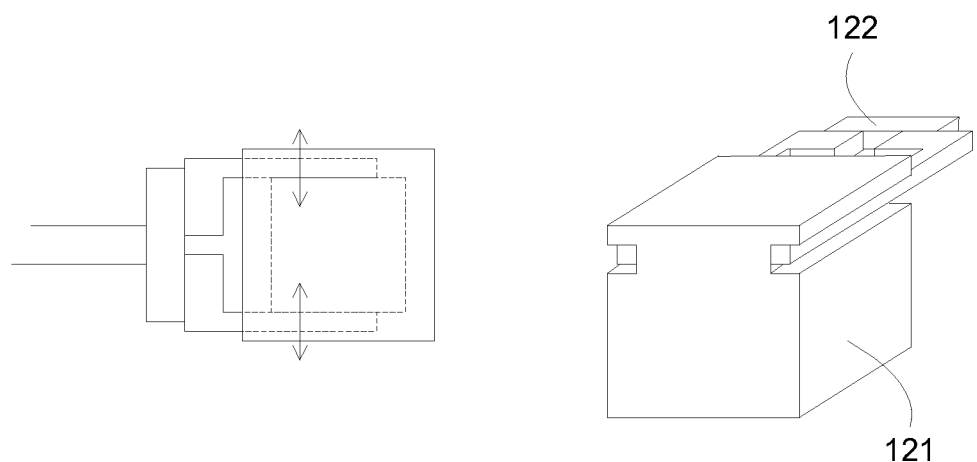

In some embodiments, the end handle can comprise gripper arms to grip the container. FIGS. 12A-12C illustrate an exemplary movement sequence of robot having gripper arms according to some embodiments of the present invention. FIG. 12A shows an exemplary container 121 having a top portion connected to a body through a connector portion 126. A robot arm 122 having an end handle 123 having movable gripper arms that can be extended 124A and retracted 124B, for example, through a motor or other forms of movement mechanism located in the end handle 123. The robot arm 122 approaches a container 121, with the gripper arms extended outside the grippable portions of the container. In FIG. 12B, the gripper arms grip the top portion of the container 121. In FIG. 12C, the gripper arms grip the connector portion 126 of the container 121.

FIGS. 13A-13I illustrate an exemplary sequence of movable gripper arms for container transfer to a storage location according to some embodiments of the present invention. A robot arm 132 is coupled to an x-y movement mechanism 112 for moving to different locations. The robot arm 132 can be extended to access container 131 in a workpiece stocker. In FIG. 13A, the robot arm 132 is extended until the gripper arms 134A surrounding the container 131 around the top portion. FIG. 13B shows a corresponding side view. In FIG. 13C, the gripper arms retract 134B to support the container. In FIG. 13D, the robot arm 132 retracts, returning the robot to the buffer storage assembly. In FIG. 13E, the x-y mechanism 112 moves the robot carrying the container 131 to the shelf 135. Afterward, the x-y mechanism 112 lowers the container 131 to the shelf 135. In FIG. 13F, the gripper arms of the end handle extend to allow the robot to move out of the container. In FIGS. 13G and 13H, x-y mechanism 112 moves the robot end handle up 134C from the container. In FIG. 13I, x-y mechanism 112 moves the robot end handle out of the container. Container can be retrieved from storage shelves by reverse operation.

In some embodiments, the end handle can be rotated at the end of the robot arm, to allow the end handle to face a workpiece from multiple directions, such as a z direction along the width, or +x or −x directions along the length of the buffer storage assembly. For example, after picking up a workpiece, the end handle can turn to face a desired storage compartment (e.g., facing x or −x direction) before entering the buffer storage assembly. In some embodiment, the end handle can have moveable forks, allowing handling the workpiece from multiple directions.

Figure 14A:
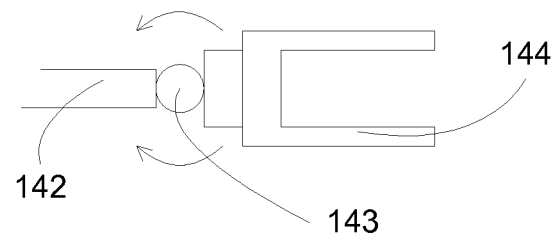
FIGS. 14A-14C illustrate an exemplary end handle rotatably connecting to a robot arm according to some embodiments of the present invention.
Figure 14B:
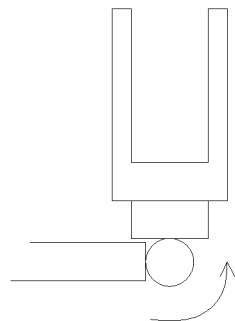
Figure 14C:
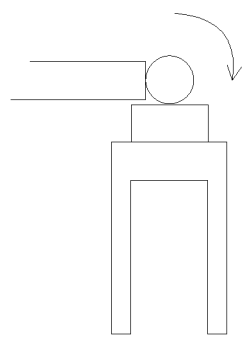

FIGS. 14A-14C illustrate an exemplary end handle rotatably connecting to a robot arm according to some embodiments of the present invention. Robot 142 is coupled to an end handle 144, shown as two prong handle, through a rotatable connection 143. The end handle can rotate in different directions, allowing the end handle to have different orientations with respect to the robot arm 142.

FIGS. 15A-15E illustrate an exemplary sequence of rotatable end handle for container transfer according to some embodiments of the present invention. A robot arm 152 is coupled to an x-y movement mechanism 112 for moving to different locations. The robot arm 152 can be extended to access a container 151 in a workpiece stocker. In FIG. 15A, the robot arm 152 is extended until the end handle enters a recess in the container 151. The end handle can be rotated to enter the container from a front side. In FIG. 15B, the end handle rotates to the direction of the future storage shelf. For example, the end handle is rotated clockwise to face storage shelf 155. In FIG. 15C, the robot arm 152 retracts, returning the robot to the buffer storage assembly. In FIG. 15D, the x-y mechanism 112 moves the robot carrying the container 151 to the shelf 155. Afterward, the x-y mechanism 112 lowers the container 151 to the shelf 155. In FIG. 15E, x-y mechanism 112 moves the robot end handle out of the container from a side. Container can be retrieved from storage shelves by reverse operation.

Figure 16A:
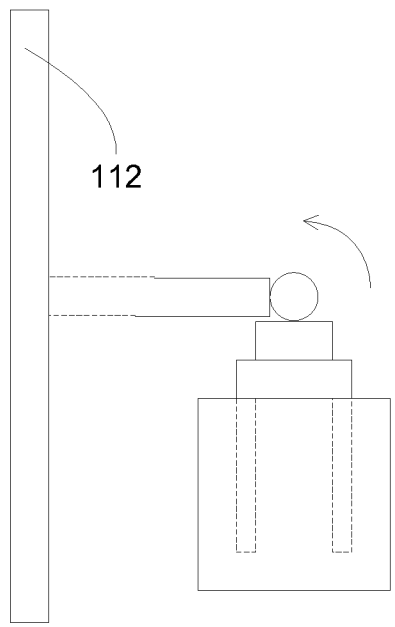
FIGS. 16A-16E illustrate another exemplary sequence of rotatable end handle for container transfer according to some embodiments of the present invention.
Figure 16B:
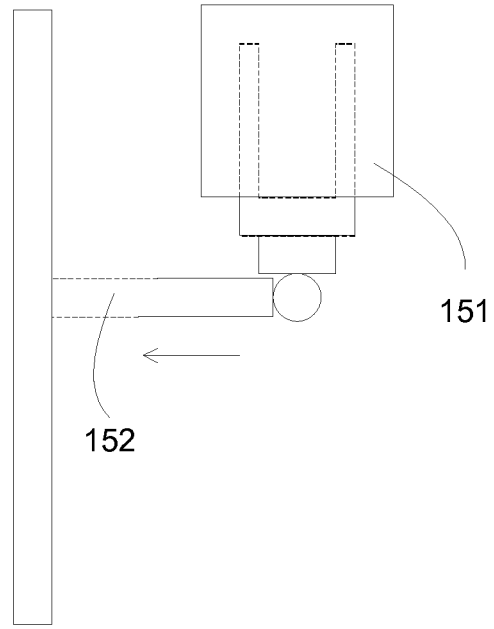
Figure 16C:
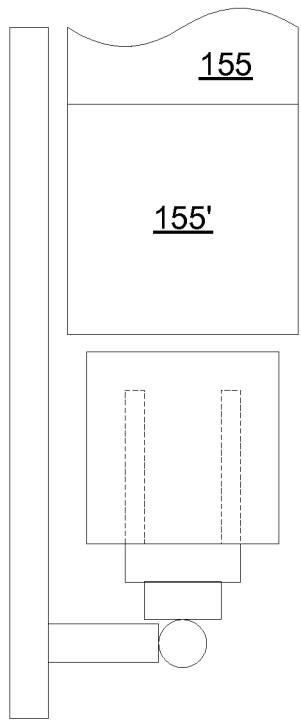
Figure 16D:
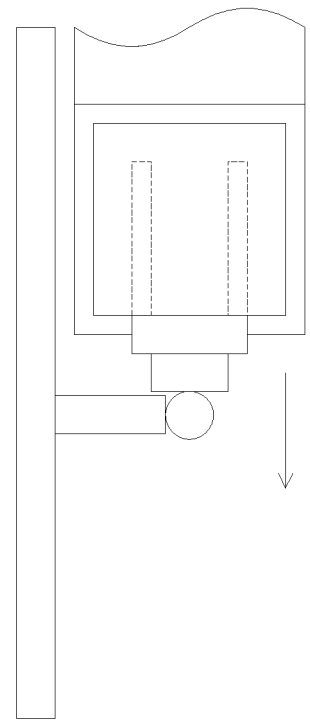
Figure 16E:
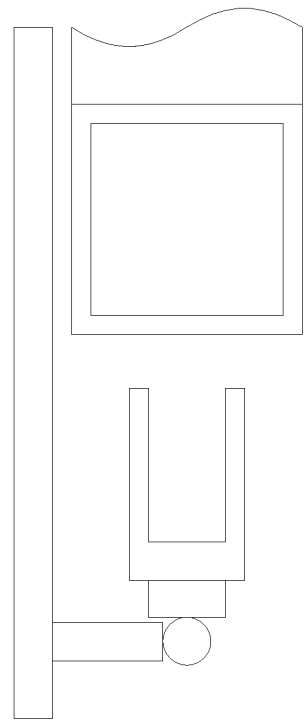

FIGS. 16A-16E illustrate another exemplary sequence of rotatable end handle for container transfer according to some embodiments of the present invention. For opposite shelf 155', the robot can rotate the end handle to approach the container 162 or the shelf 155' from different direction. In FIG. 16A, the extended robot arm 152 is moved until the end handle enters a recess in the container 151. The end handle can be rotated to enter the container from a front side. In FIG. 16B, the end handle rotates to the direction of the future storage shelf. For example, the end handle is rotated counterclockwise to face storage shelf 155'. In FIG. 16C, the robot arm 152 retracts, returning the robot to the buffer storage assembly. In FIG. 16D, the x-y mechanism 112 moves the robot carrying the container 151 to the shelf 155'. Afterward, the x-y mechanism 112 lowers the container 151 to the shelf 155'. In FIG. 16E, x-y mechanism 112 moves the robot end handle out of the container from a side. Container can be retrieved from storage shelves by reverse operation.

In some embodiments, the robot system comprises an extension mechanism to extend the end handle away from the x-y plane (e.g., the plane formed by the x-y movement mechanism, or by the x-y arrays of storage compartments). The end handle can be extended to reach to the attached workpiece stocker, for example, toward a loadlock station or an intermediate station. The end handle can be coupled to a bending robot arm, to allow the end handle to avoid obstacles during the extension of the robot arm. For example, the equipment can comprise two loadlocks arranged along the z direction (e.g., away from the buffer storage assembly), and the robot arm is therefore configured to reach over the closer loadlock to pick or place a workpiece disposed in the farther loadlock. The end handle can be retracted to a position aligning with the storage compartments. At the retracted position, the end handle can be transported by the x-y movement mechanism, preferably along the transport pathways.

The extension mechanism can comprise folded arms with one end coupled to the x-y movement mechanism, and the other end coupled to the end handle. When extended, the folded arms stretch along the z direction to reach the workpiece disposed within the equipment. When folded, the folded arms can be folded along an x direction (e.g., along the length of the buffer storage assembly), or along a y direction (e.g., along the height of the buffer storage assembly). In some embodiments, the folded arms are extended within a pathway to avoid the storage compartments. For example, an x-folded arms can be extended when positioned at a horizontal path way, and a y-folded arms can be extended when positioned at a vertical path way. Alternatively, the extension mechanism can comprise other mechanisms, such as a telescoping mechanism or a scissor mechanism. The extended mechanism for the robot arm to reach into the workpiece stocker can be positioned in an x direction (e.g., along a length of the buffer assembly), a y direction (e.g., along a height of the buffer assembly), or in any other directions.

Figure 17A:
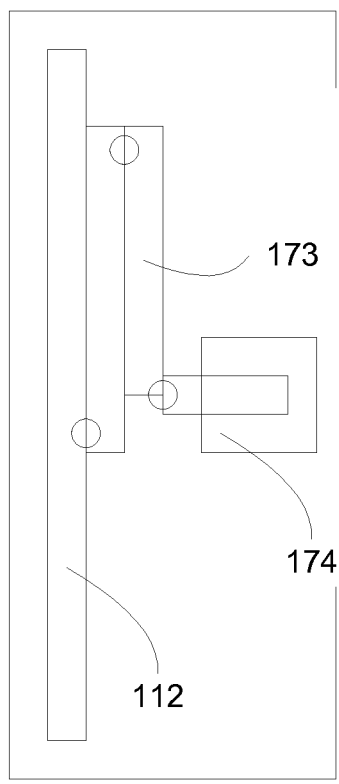
FIGS. 17A-17D illustrate exemplary configurations of a robot arm according to some embodiments of the present invention.
Figure 17B:
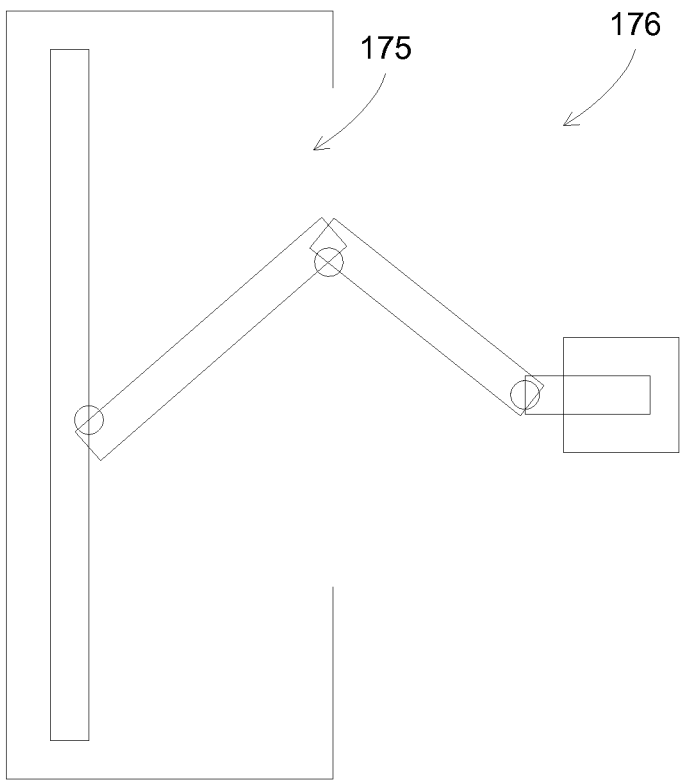
Figure 17C:
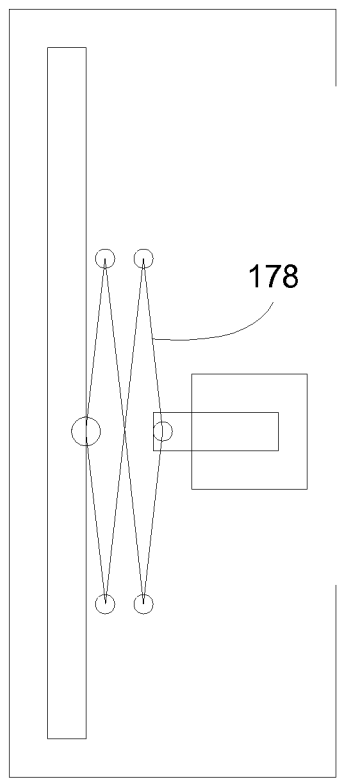
Figure 17D:
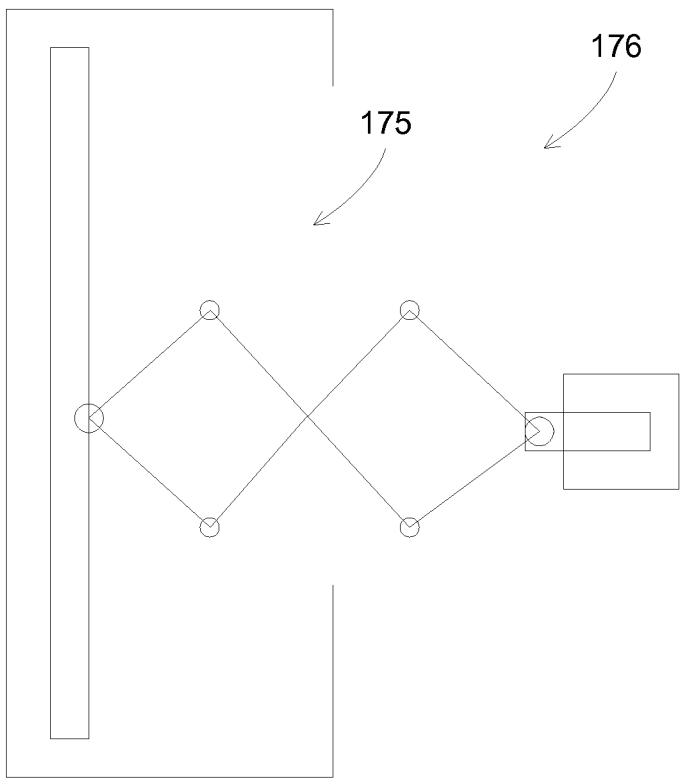

FIGS. 17A-17D illustrate exemplary configurations of a robot arm according to some embodiments of the present invention. In FIG. 17A, the robot arm comprises folded arms 173 coupled to movement mechanism 112. In FIG. 17B, the robot arm comprises scissor arms 178 coupled to movement mechanism 112. The robot arm, when folded, keeps a container 174 in the buffer storage assembly 175. The robot arm, when extended, reaches to a container stored in a loading station in the workpiece stocker 176.

FIGS. 18A-18D illustrate exemplary configurations of a robot arm with rotatable end handle according to some embodiments of the present invention. In FIG. 18A, the robot arm comprises folded arms 183 coupled to movement mechanism 112. The folded arms 183 are folded and extended along an x direction, e.g., along a length of the buffer assembly 175. The robot arm, when folded, keeps a container 184 in the buffer storage assembly 175. The end handle supporting container 184 is coupled to a rotating mechanism 188, with is rotated to be parallel with the movement mechanism 112. The end handle supporting container 184 is rotated to reach the loading station of the workpiece stocker 176, entering the loading station from a direction perpendicular to the buffer assembly 175. In FIG. 18B, the robot arm also comprises folded arms 189, but folded and extended along a y direction, e.g., along a height of the buffer assembly 175. The robot arms, when folded, keep a container in a perpendicular direction with the mechanism 112. The end handle supporting container is rotated to reach the loading station of the workpiece stocker 176, entering the loading station from a direction parallel to the buffer assembly 175.

Figure 19A:
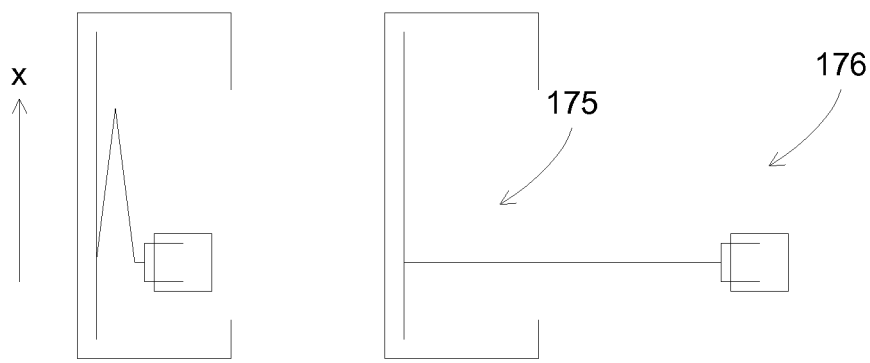
FIGS. 19A-19D illustrate exemplary configurations of folded arms with different end handles according to some embodiments of the present invention.
Figure 19B:
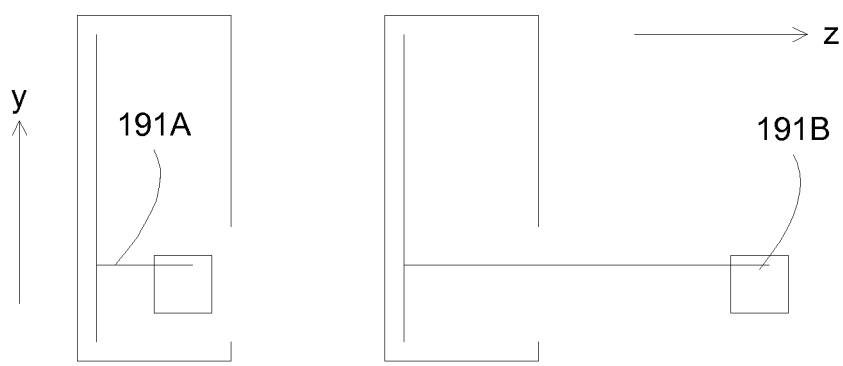

In some embodiments, the end handle can be disposed at a same plane or at different plane then the robot arms. The bend end handle can allow the robot arms to avoid obstacle. FIGS. 19A-19D illustrate exemplary configurations of folded arms with different end handles according to some embodiments of the present invention. FIG. 19A shows a top view of the buffer assembly 175 and the workpiece stocker 176 along an x direction (e.g., along a length of the buffer assembly), showing a linear end handle configuration. FIG. 19B shows a side view of the buffer assembly 175 and the workpiece stocker 176 along a y direction (e.g., along a height of the buffer assembly). The end handle 191B is connected as a linear extension of the robot arms 191A, allowing the robot arms to handle containers positioned in z direction, e.g., toward the workpiece stocker 176.

Figure 19C:
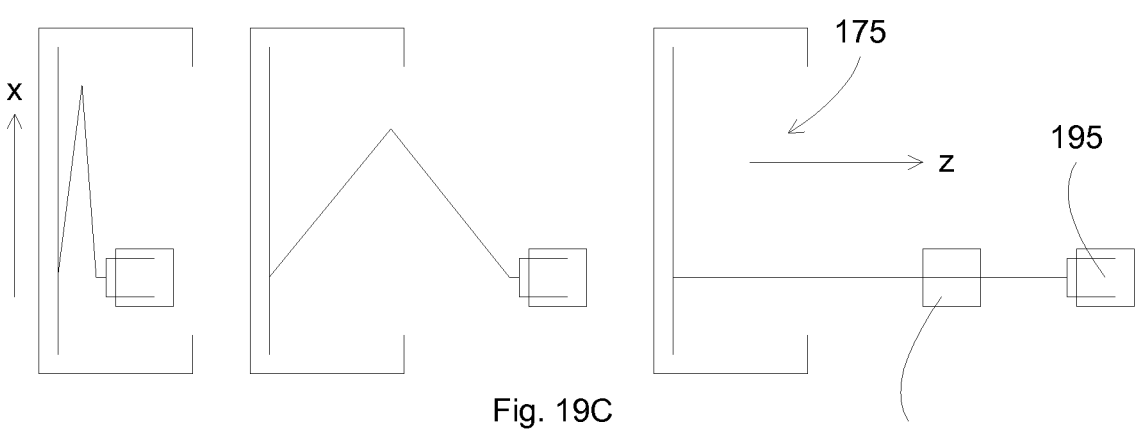
Figure 19D:
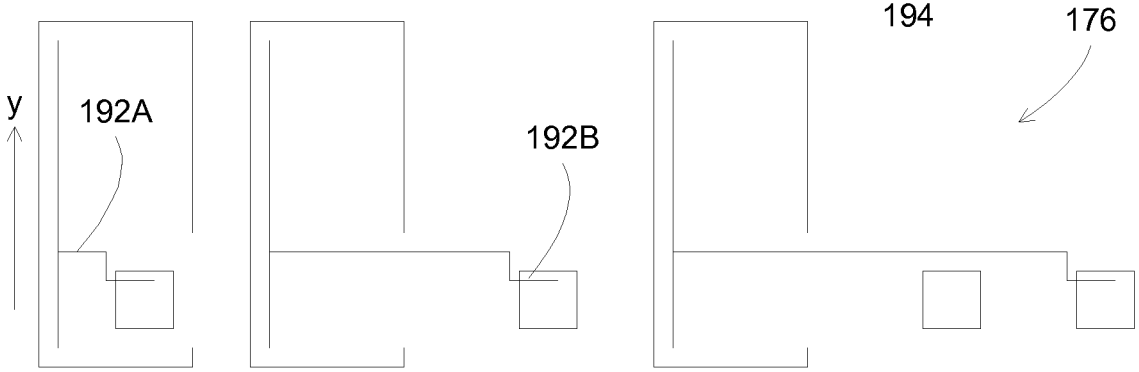
Figure 21A:
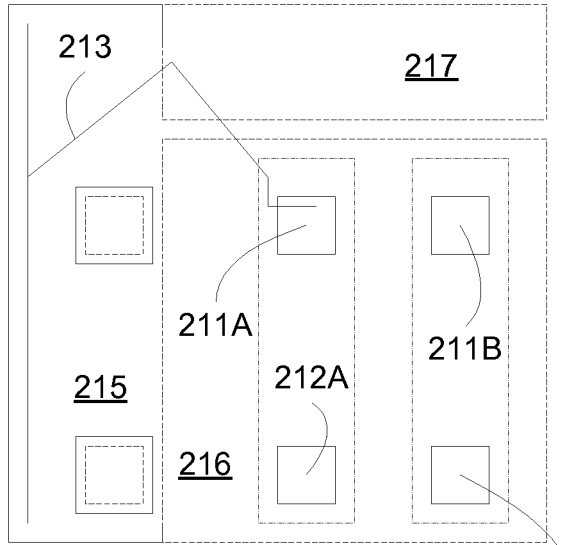
FIGS. 21A-21D illustrate exemplary access sequences of robot arms according to some embodiments of the present invention.
Figure 21B:
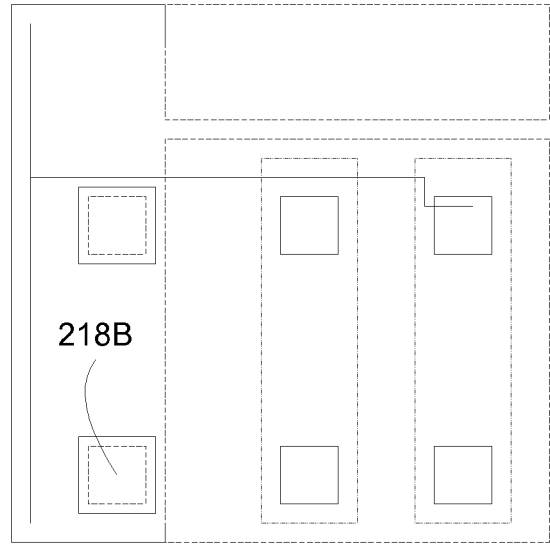
Figure 21C:
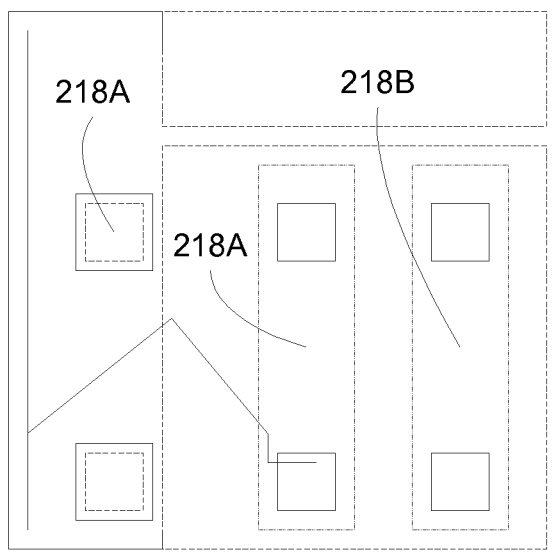
Figure 21D:
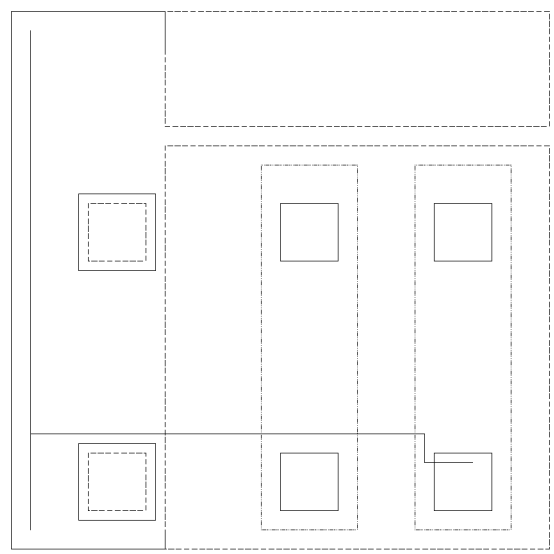

FIG. 19C shows a top view of the buffer assembly 175 and the workpiece stocker 176 along an x direction, showing a bended end handle configuration. FIG. 19D shows a side view of the buffer assembly 175 and the workpiece stocker 176 along a y direction. The end handle 192B is bended from the robot arms 192A, disposed at a different plane from the robot arm when extended. The bended section allows the robot arms to avoid loading station 194 in the path of the robot arm, allowing handling container disposed in a farther loading station 195.

FIGS. 20A-20C illustrate an exemplary robot arm with bended end handle according to some embodiments of the present invention. The robot arms comprise section 202A and 202B joined by coupling 209. End handle 203 comprises a bend section, and joins with arm section 202B through joint 208. The bend section allows the robot to access container in farther loading station 205, avoiding the closer loading station 204. Other configurations for accessing both loading stations can also be used, such as curve robot arms instead of bended end handle.

In some embodiments, the buffer storage assembly comprises a transfer location for the robot arm to be extended to reach a station of the workpiece stocker. At the transfer location, the robot can be extended out of the buffer storage plane. The transfer location can be disposed at positions corresponded to a station of the workpiece stocker, such as a transfer station or a loadlock station. In some embodiments, the buffer storage assembly comprises multiple transfer locations, for example, a transfer location for handle a manual loadlock station of the workpiece stocker, and another transfer location for handle an automatic transport station.

For example, the workpiece stocker can comprise an automatic transport station coupled to an overhead transport line linking different equipments. The automatic transport station can be disposed at the top of the equipment to ease the connection. A mobile launch platform can be used to couple the automatic transport station with the manual loadlock station, allowing the workpiece stocker to accept automatic transport of workpiece containers, in addition to manual transport at manual loadlock stations. The buffer storage assembly can comprise a transfer location for direct access to the automatic transport station, linking the buffer storage chamber to the automatic transport line. The containers and workpieces stored in the buffer storage chamber can be exchanged with other equipments, allowing a buffer storage assembly to serve multiple equipments, such as multiple bare workpiece stockers.

FIGS. 21A-21D illustrate exemplary access sequences of robot arms according to some embodiments of the present invention. Buffer assembly 215 is positioned next to stocker 216 for storing workpieces or containers. Buffer assembly 215 comprises transfer locations or stations 218A and 218B for transferring to the stocker 216. Robot 213 can move a container from upper transfer station 218A to overhead loading station 211A or 211B. Robot 213 can also move a container from lower transfer station 218B to manual loading station 212A or 212B. Bended end handle allows the robot arm 213 to avoid the closer station 211A or 212A to reach the farther station 211B or 212B, respectively. Overhead transport assembly 217 is disposed next to the overhead transport stations 211A and 211B, allowing automatic transferring containers between equipments. Transfer mechanism, such as a mobile launch platform 218A, can be coupled between the manual loading station 212A and overhead loading station 211A for transfer containers between these two loading stations. Optional transfer mechanism 218B can be included for connection between stations 211B and 212B.

In some embodiments, the present invention discloses a buffer storage assembly to be coupled to a bare workpiece stocker, for example, to store and to supply empty containers to the bare workpiece stocker. The buffer storage assembly can also be used to store containers having workpieces stored therein. The above description describes a buffer assembly for storing containers during coupling to a workpiece stocker, but the invention is not so limited, and can be applied to a buffer assembly storing workpieces.

In some embodiments, the present invention discloses a combination workpiece stocker comprising a bare workpiece stocker coupled to a buffer storage assembly. The buffer storage assembly can be separated from the bare workpiece stocker, and coupled only at the container transfer level. Alternatively, the buffer storage assembly can be fully integrated to the bare workpiece stocker, forming a complete system having multiple capabilities. In some embodiments, the present invention discloses a bare workpiece stocker having additional storage capability to store containers. The number of container storage can be limited, and mainly served to provide containers to the bare workpiece stocker in limited situations, such as emergency or special circumstances. Extra containers can be transported manually or automatically to an external storage.

Figure 22:
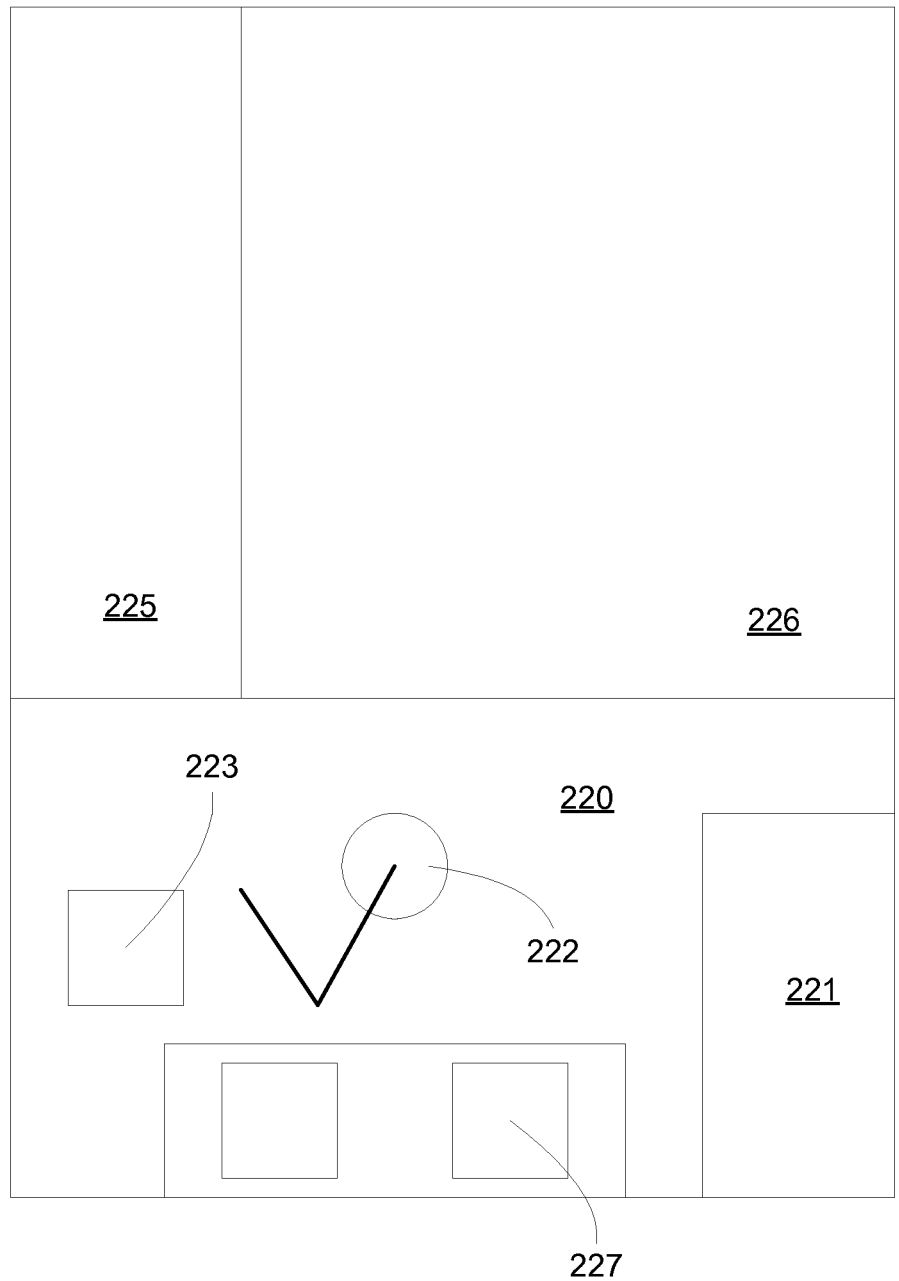
FIG. 22 illustrates an integrated stocker having a storage chamber 226 for bare workpiece storage, and storage chamber 225 for container storage, and portion 220 for workpiece and container handling.

FIG. 22 illustrates an integrated stocker having a storage chamber 226 for bare workpiece storage, and storage chamber 225 for container storage, and portion 220 for workpiece and container handling. Loading stations 227 are configured for manual or automatic loading and unloading containers. Transfer station 223 is optionally included for either container or workpiece support. Robot 222 can handle workpieces and workpiece containers between loading station 227 and storage chambers 225 and 226. Controller 221 contains programs, sensors and commands to operate the stocker.

In some embodiments, the present invention discloses methods for coupling a buffer storage assembly with a bare workpiece stocker. The buffer storage assembly preferably comprises its own internal robot for accessing the storage locations, together with an extendable robot arm for accessing a container disposed at a loading station of the workpiece stocker.

Figure 23:
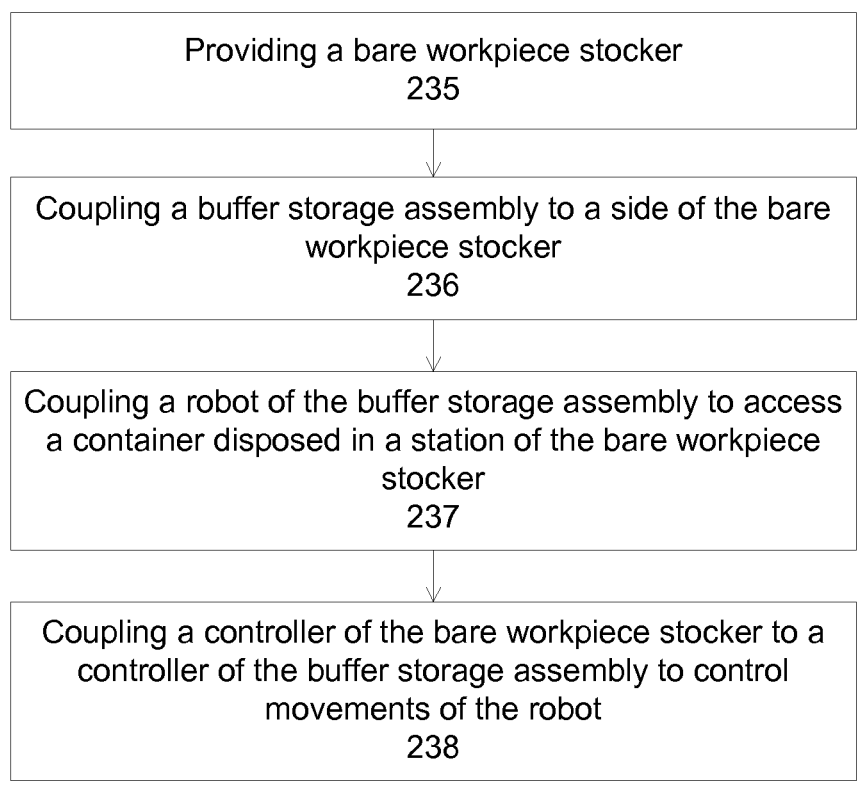
FIG. 23 illustrates an exemplary flowchart for assembling a buffer storage assembly with a workpiece stocker according to some embodiments of the present invention.

FIG. 23 illustrates an exemplary flowchart for assembling a buffer storage assembly with a workpiece stocker according to some embodiments of the present invention. Operation 235 provides a bare workpiece stocker. Operation 236 couples a buffer storage assembly to a side of the bare workpiece stocker. Operation 237 couples a robot of the buffer storage assembly to access a container disposed in a station of the bare workpiece stocker. Operation 238 couples a controller of the bare workpiece stocker to a controller of the buffer storage assembly to control movements of the robot.

In some embodiments, the present invention discloses methods for utilizing a buffer storage assembly with a bare workpiece stocker.

Figure 24A:
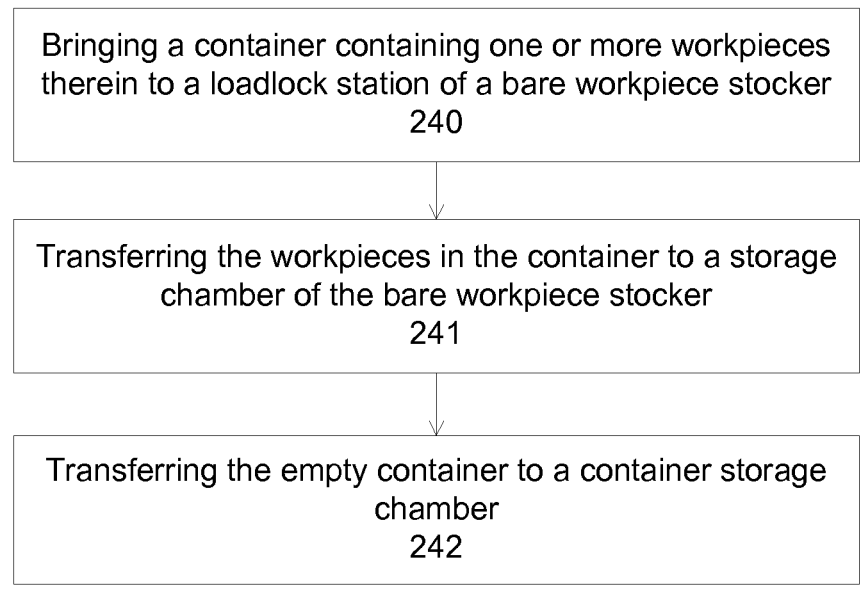
FIGS. 24A-24C illustrate exemplary flowcharts for operating a bare workpiece stocker according to some embodiments of the present invention.
Figure 24B:
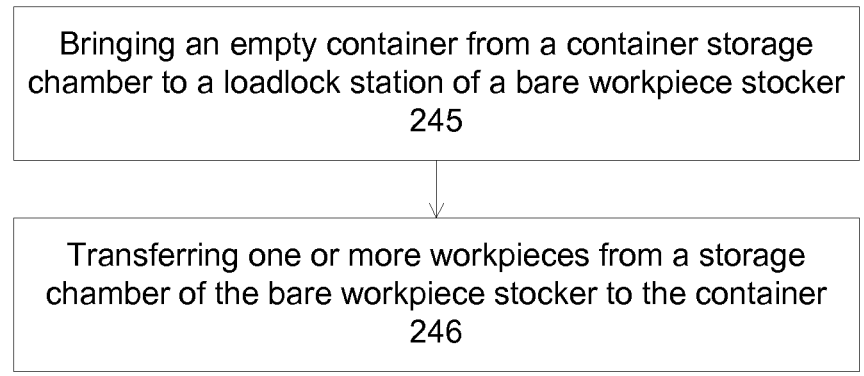
Figure 24C:
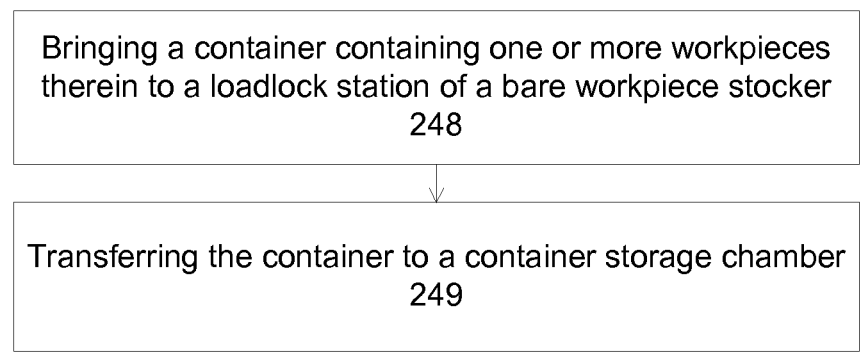

FIGS. 24A-24C illustrate exemplary flowcharts for operating a bare workpiece stocker according to some embodiments of the present invention. An empty container can be stored in the buffer storage assembly after the workpieces have been removed and stored in the bare workpiece stocker. In an exemplary sequence, a container containing one or more workpieces therein is brought to a loadlock station of the bare workpiece stocker. The container can be a reticle container containing a reticle, or a wafer container containing a plurality of wafers. The bare workpiece stocker opens the container, receives the workpieces, and transfers the workpieces to the bare workpiece storage chamber. The container is closed, and can be transferred to be stored in the buffer storage assembly. For example, the robot arm of the buffer storage assembly is extended to reach the loadlock station and pick up the container by the end handle. The robot arm is retracted, bringing the container to a position within a pathway of the buffer storage assembly. The x-y movement mechanism then moves the robot arm, and the container supported by the end handle, to a desired storage compartment. The container is then placed in the storage compartment, and the x-y movement mechanism returns the robot to a rest position.

In FIG. 24A, after a container is brought to a bare workpiece stocker, the workpieces are transferred to the bare workpiece stocker, and the container is stored in the buffer storage assembly. Operation 240 brings a container containing one or more workpieces therein to a loadlock station of a bare workpiece stocker. Operation 241 transfers the workpieces in the container to a storage chamber of the bare workpiece stocker. Operation 242 transfers the empty container to a container storage chamber.

Operation to removing workpieces from the bare workpiece stocker is reverse. For example, an empty container can be brought out from the buffer storage assembly to store the workpieces that are retrieved from the bare workpiece stocker. In an exemplary sequence, an empty container is brought from a storage compartment to a loadlock of the bare workpiece stocker. For example, the x-y movement mechanism moves the robot arm to a desired storage compartment to pick up an empty container. The container is picked up by the end handle, and the x-y movement mechanism moves the robot to a transfer location. At the transfer location, the robot arm of the buffer storage assembly is extended to reach the loadlock station and place the container in the loadlock station. The robot arm is retracted, and the bare workpiece stocker can transfer a desired number of workpieces to be stored in the empty container.

In FIG. 24B, an empty container is brought to the bare workpiece stocker to hold the workpieces taken from the stocker. Operation 245 brings an empty container from a container storage chamber to a loadlock station of a bare workpiece stocker. Operation 246 transfers one or more workpieces from a storage chamber of the bare workpiece stocker to the container.

In some embodiments, the buffer storage assembly can be used to store containers having workpieces stored within. The whole assembly of bare workpiece stocker and the buffer storage assembly can have the added functionality of bare workpiece storage and workpieces storage within containers, in addition to empty container storage capability.

In FIG. 24C, a container containing workpieces is stored in the buffer storage assembly. Operation 248 brings a container containing one or more workpieces therein to a loadlock station of a bare workpiece stocker. Operation 249 transfers the container to a container storage chamber.

In some embodiments, the buffer storage assembly can serve as a loading buffer for the bare workpiece stocker. The bare stocker can receive a plurality of containers containing workpieces to be stored in the bare stocker. If the containers arrive faster than the rate of removing workpieces, the containers might be queuing, clogging the transport line or wasting operator time. The buffer assembly can be used as a loading buffer storage, storing the containers to clear the queue, and then bring back the containers so that the workpieces can be transferred to the bare stocker.

Figure 25A:
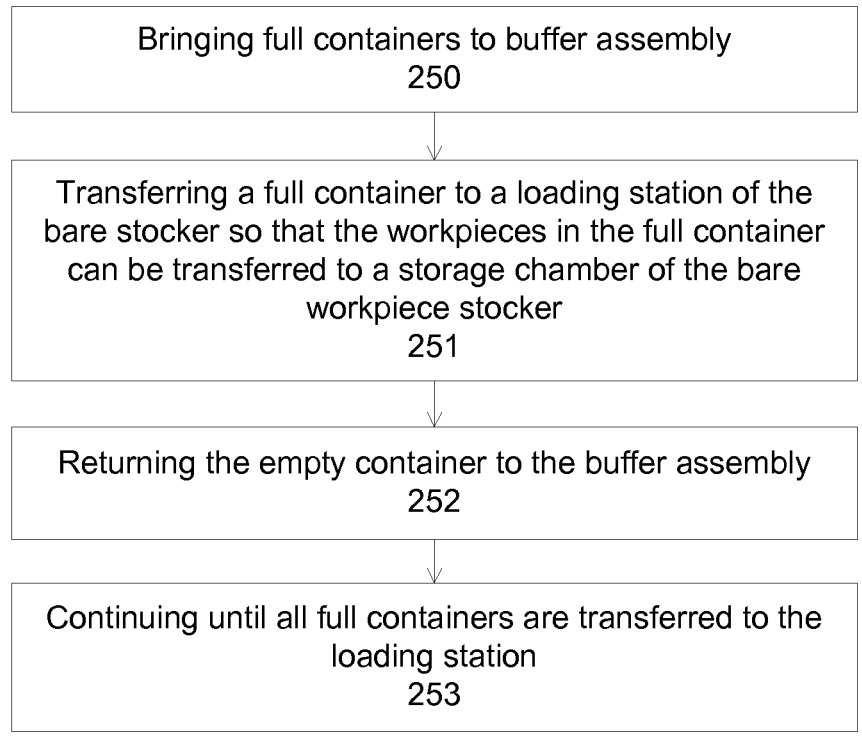
FIGS. 25A-25B illustrate exemplary flowcharts for utilizing the buffer assembly as loading or unloading buffer storage according to some embodiments of the present invention.
Figure 25B:
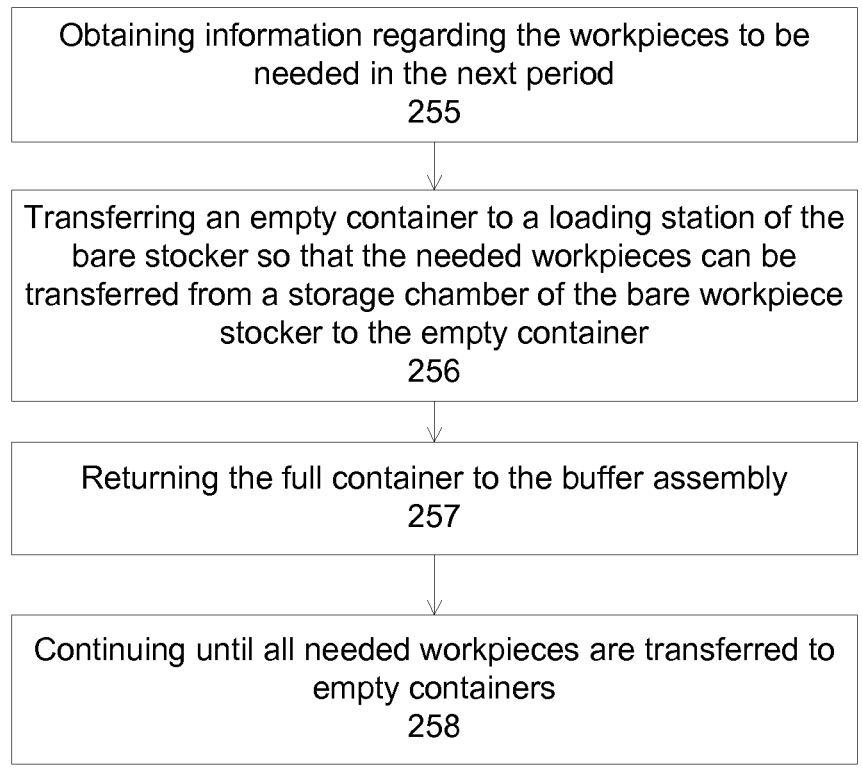

FIGS. 25A-25B illustrate exemplary flowcharts for utilizing the buffer assembly as loading or unloading buffer storage according to some embodiments of the present invention. In FIG. 25A, the buffer assembly can serve as a loading buffer storage to clear the queue of the containers reaching the bare stocker. Operation 250 brings full containers to buffer assembly. Operation 251 transfers a full container to a loading station of the bare stocker so that the workpieces in the full container can be transferred to a storage chamber of the bare workpiece stocker. Operation 252 returns the empty container to the buffer assembly. Operation 253 continues until all full containers are transferred to the loading station.

In some embodiments, the buffer storage assembly can serve as an unloading buffer for the bare workpiece stocker. At certain times, the facility might require a faster rate of container transfer than the bare stocker can deliver, and the bare stocker can affect the throughput of the facility if this demand is not satisfied. The bare stocker can assemble the containers ahead of time, and store the assembled containers in the buffer assembly, so that when needed, containers are ready to send. The controller of the bare stocker can communicate with the facility to know the workpieces to be needed in the next period, such as the next 6 hours, 12 hours or 24 hours. These workpieces are assembled. The buffer assembly can be used as an unloading buffer storage, storing the assembled containers to be sent when needed.

In FIG. 25B, the buffer assembly can serve as an unloading buffer storage to achieve a throughput demand of the facility, which exceeds the throughput of the bare stocker. Operation 255 obtains information regarding the workpieces to be needed in the next period. Operation 256 transfers an empty container to a loading station of the bare stocker so that the needed workpieces can be transferred from a storage chamber of the bare workpiece stocker to the empty container. Operation 257 returns the full container to the buffer assembly. Operation 258 continues until all needed workpieces are transferred to empty containers.

The present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g. a processor. The software may be stored in a computer or a controller, which operates the equipment.

Figure 26A:
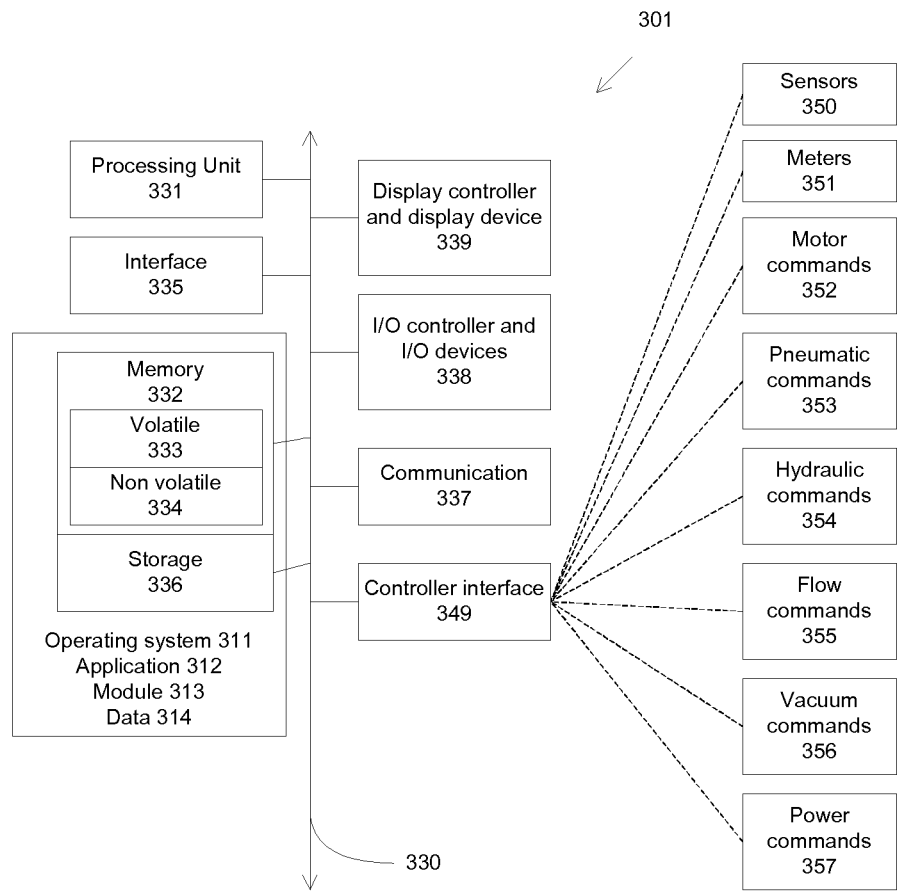
FIGS. 26A-26B illustrate an exemplary controller system according to some embodiments of the present invention.

With reference to FIG. 26A, an exemplary environment for implementing various aspects of the invention includes a controller 301, comprising a processing unit 331, a system memory 332, and a system bus 330. The processing unit 331 can be any of various available processors, such as single microprocessor, dual microprocessors or other multiprocessor architectures. The system bus 330 can be any type of bus structures or architectures, such as 12-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 332 can include volatile memory 333 and nonvolatile memory 334. Nonvolatile memory 334 can include read only memory (ROM), programmable ROM (PROM), electrically programmable ROM (EPROM), electrically erasable ROM (EEPROM), or flash memory. Volatile memory 333, can include random access memory (RAM), synchronous RAM (SRAM), dynamic RAM (DRAM), synchronous DRAM (SDRAM), double data rate SDRAM (DDR SDRAM), enhanced SDRAM (ESD-RAIVI), Synchlink DRAM (SLDRAM), or direct Rambus RAM (DRRAM).

Controller 301 also includes storage media 336, such as removable/nonremovable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 335 can be used to facilitate connection.

The controller system 301 further can include software to operate, such as an operating system 311, system applications 312, program modules 313 and program data 314, which are stored either in system memory 332 or on disk storage 336. Various operating systems or combinations of operating systems can be used.

Input devices can be used to enter commands or data, and can include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 338. Interface ports 338 can include a serial port, a parallel port, a game port, a universal serial bus (USB), and a 1394 bus. The interface ports 338 can also accommodate output devices. For example, a USB port may be used to provide input to controller 301 and to output information from controller 301 to an output device. Output adapter 339, such as video or sound cards, is provided to connect to some output devices such as monitors, speakers, and printers.

Controller 301 can operate in a networked environment with remote computers, which can be a personal computer, a server, a router, a network PC, a workstation, a microprocessor based appliance, a peer device or other common network node and the like, and typically includes many or all of the elements described relative to controller 301. Remote computers can be connected to controller 301 through a network interface and communication connection 337. Network interface can be communication networks such as local-area networks (LAN) and wide area networks (WAN). LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

Controller 301 can comprise controller interface 349 to receive inputs and send commands to different assembly systems. The controller interface 349 can receive sensor inputs 350 and meter inputs 251, such as temperature input, flow rate input, location input, or failure input from any installed sensors. The controller interface 349 can send commands to the stocker or the buffer assembly, such as motor commands 352, pneumatic commands 352, hydraulic commands 353, flow commands 354, vacuum commands 355, or power commands 356.

Figure 26B:
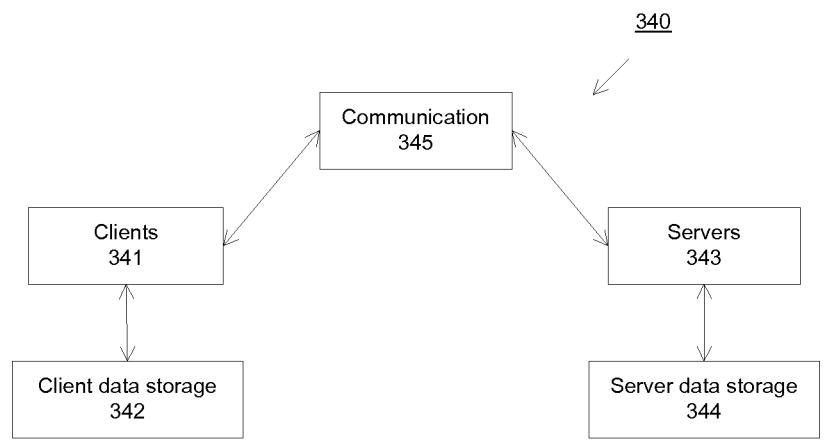

FIG. 26B is a schematic block diagram of a sample computing environment 340 with which the present invention can interact. The system 340 includes a plurality of client systems 341. The system 340 also includes a plurality of servers 343. The servers 343 can be used to employ the present invention. The client system 341 can be a facility computer or controller, serving to operate the fabrication facility. The system 340 includes a communication network 345 to facilitate communications between the clients 341 and the servers 343. Client data storage 342, connected to client system 341, can store information locally. Similarly, the server 343 can include server data storages 344.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

What is claimed is:

1. A buffer storage add-on for a workpiece stocker, comprising:

a storage chamber, wherein the storage chamber comprises a first outside sidewall exterior face having a closable opening, wherein the first outside sidewall exterior face is configured to be coupled with a second outside sidewall of the workpiece stocker so as to be sealed with a second outside sidewall exterior face of the workpiece stocker, such that the first outside sidewall exterior face faces opposite the second outside sidewall exterior face, the second outside sidewall exterior face having another closable opening different and distinct from the closable opening of the first outside sidewall exterior face, wherein a shared interior environment, between the workpiece stocker and the storage chamber via the closable opening and the another closable opening, is sealed from an outside environment with both the closable opening and the another closable opening both open;

wherein the second outside sidewall exterior face of the workpiece stocker is different than a front sidewall of the workpiece stocker, the front sidewall including a load lock station, wherein the load lock station is separate and distinct from the second outside sidewall of the workpiece stocker; and a container handler mounted in the storage chamber, the container handler comprising an end handle for supporting a container, the container handler comprising an extension mechanism for extending the end handle;

wherein the end handle is configured to be extended through the closable opening of the first outside sidewall exterior face beyond the first outside sidewall exterior face, passing through the another closable opening of the second outside sidewall exterior face to an inside of the workpiece stocker towards the front sidewall.

2. The buffer storage add-on of claim 1, further comprising transport pathways, wherein the extension mechanism comprises a foldable arm folding and extending along a row transport pathway of the transport pathways or along a column transport pathway of the transport pathways.

3. The buffer storage add-on of claim 1, wherein the end handle comprises one or more activated grippers facing in a z-direction for gripping the container.

4. The buffer storage add-on of claim 1, wherein the end handle is coupled to the container handler at a bend section to enable the end handle to pick or place the container around a solid object.

5. The buffer storage add-on of claim 1, further comprising
wherein the front sidewall of the workpiece stocker comprises the load lock station configured for operator access, and
wherein the end handle is configured to transfer the container from a plurality of storage compartments of the storage chamber to the load lock station.

6. The buffer storage add-on of claim 1, wherein
the front sidewall of the workpiece stocker comprises two load lock stations configured for operator access,
the two load lock stations are disposed along an extended path of the extension mechanism, and
the end handle is coupled to the container handler at a bend section to enable the end handle to pick or place the container around a load lock station of the two load lock stations.

7. The buffer storage add-on of claim 1, wherein a z-direction is parallel to the front sidewall of the workpiece stocker.

8. The buffer storage add-on of claim 1, wherein
the extension mechanism is also configured to retract the end handle, and
the end handle in retracted configuration, is disposed inside of the front sidewall of the workpiece stocker.

9. A container storage add-on for a workpiece stocker, the workpiece stocker adapted to accept containers having workpieces stored therein at one or more loading station, and storing the workpieces in a workpiece storage chamber, the container storage add-on comprising:
a container storage chamber comprising a plurality of container storage compartments arranged in a two dimensional x-y array, wherein the container storage chamber comprises a first outside sidewall exterior face having a closable opening, wherein the first outside sidewall exterior face is configured to be coupled to a second outside sidewall exterior face of the workpiece stocker such that the first outside sidewall exterior face faces opposite the second outside sidewall exterior face, the second outside sidewall exterior face having another closable opening different and distinct from the closable opening of the first outside sidewall exterior face, wherein the second outside sidewall exterior face of the workpiece stocker is different than a front sidewall of the workpiece stocker, wherein the two dimensional x-y array defines an x-y plane;
an x-y mechanism coupled to the container storage chamber; and
an arm comprising an end handle for supporting the containers, the arm comprising an extension mechanism for extending the end handle in a z-direction, wherein the z-direction is a direction not in the x-y plane, wherein the end handle is configured to be extended through the closable opening of the first outside sidewall exterior face beyond the first outside sidewall exterior face, passing through the another closable opening of the second outside sidewall exterior face to an inside of the workpiece stocker.

10. The container storage add-on of claim 9, further comprising wherein the end handle is configured to transfer the container from the plurality of storage compartments to the loading station.

11. The container storage add-on of claim 9, wherein
the one or more loading station being disposed on a front sidewall of the workpiece stocker and comprising two loading stations configured for operator access,
the two loading stations are disposed along an extended path of the extension mechanism, and
the end handle is coupled to the arm at a bend section to enable the end handle to pick or place the container around a loading station of the two loading stations.

12. The container storage add-on of claim 9, wherein the z-direction is parallel to the front sidewall of the workpiece stocker.

13. The container storage add-on of claim 9, wherein
the extension mechanism is also configured to retract the end handle, and
the end handle in retracted configuration, is disposed inside of the front sidewall of the workpiece stocker.

14. The container storage add-on of claim 9, wherein the end handle is coupled to the arm at a bend section to enable the end handle to pick or place the container around a solid object.

15. The container storage add-on of claim 9, wherein the arm is extended for picking or for placing the container at a manual loading station or an automatic overhead transport station of the workpiece stocker.

16. A bare workpiece stocker, comprising:
a bare workpiece storage for storing bare workpieces;
at least one loading station for accepting a workpiece container having workpieces stored therein; and
a container storage buffer interfacing with the loading station for supplying to or storing empty containers from the at least one loading station, wherein the container storage buffer comprises a first sidewall exterior face having a closable opening, wherein the first sidewall exterior face is coupled to a second sidewall exterior face of the bare workpiece stocker such that the first sidewall exterior face faces opposite the second sidewall exterior face, the second sidewall exterior face having another closable opening different and distinct from the closable opening of the first sidewall exterior face, wherein the second sidewall exterior face of the bare workpiece stocker is different than a front sidewall of the bare workpiece stocker, wherein the container storage buffer comprises
a container storage chamber, and
a robot arm comprising an end handle for supporting the workpiece container, the robot arm comprising an extending mechanism for extending the end handle,
wherein the end handle is configured to extend through the closable opening of the first sidewall exterior face beyond the first sidewall exterior face, passing through the another closable opening to remove the workpiece container from the at least one loading station, through the second sidewall exterior face, to the container storage buffer.

17. The bare workpiece stocker of claim 16, wherein the end handle comprises one or more activated grippers facing in a z-direction for gripping the workpiece container or a bare workpiece.

18. The bare workpiece stocker of claim 16, wherein the end handle is configured to transfer the workpiece container from a plurality of storage compartments of the container storage chamber to the loading station.

19. The bare workpiece stocker of claim 16, wherein
the at least one loading station, disposed on the front sidewall of the workpiece stocker, comprises two loading stations configured for operator access, wherein the two loading stations are disposed along an extended path of the extension mechanism, and
the end handle is coupled to the robot arm at a bend section to enable the end handle to pick or place the container around a loading station of the two loading stations.

20. The bare workpiece stocker of claim 16, wherein the extension mechanism is also configured to retract the end handle, wherein the end handle in retracted configuration, is disposed inside of the front sidewall of the bare workpiece stocker.

* * * * *